US006992484B2

(12) United States Patent
Frank

(10) Patent No.: US 6,992,484 B2
(45) Date of Patent: Jan. 31, 2006

(54) METHOD FOR ANALYZING MRI DIFFUSION DATA

(75) Inventor: Lawrence R. Frank, Coronado, CA (US)

(73) Assignees: The Regents of the University of California, Oakland, CA (US); The United States of America as represented by the Department of Veterans Affairs, Washington, DC (US)

( * ) Notice: Subject to any disclaimer, the term of this patent is extended or adjusted under 35 U.S.C. 154(b) by 93 days.

(21) Appl. No.: 10/680,869

(22) Filed: Oct. 6, 2003

(65) Prior Publication Data
US 2005/0068031 A1 Mar. 31, 2005

Related U.S. Application Data

(63) Continuation-in-part of application No. PCT/US02/12668, filed on Apr. 6, 2002.
(60) Provisional application No. 60/282,033, filed on Apr. 6, 2001.

(51) Int. Cl.
G01V 3/00 (2006.01)

(52) U.S. Cl. .................................. 324/307; 600/410
(58) Field of Classification Search ................. 324/307, 324/308, 309, 312, 314, 300; 600/410, 419
See application file for complete search history.

(56) References Cited

U.S. PATENT DOCUMENTS

| 4,516,582 | A | | 5/1985 | Redington ................... 324/309 |
|---|---|---|---|---|
| 4,528,985 | A | | 7/1985 | Mocovski .................... 324/309 |
| 4,647,857 | A | | 3/1987 | Taber .......................... 324/309 |
| 4,714,081 | A | | 12/1987 | Dumoulin et al. .......... 324/306 |
| 4,777,957 | A | | 10/1988 | Wehrli et al. ............... 324/306 |
| 4,836,209 | A | | 6/1989 | Nishimura ................... 324/306 |
| 4,843,322 | A | | 6/1989 | Glover ........................ 324/309 |
| 4,868,501 | A | | 9/1989 | Conolly ....................... 324/309 |
| 4,901,020 | A | | 2/1990 | Ladebeck et al. ........... 324/309 |
| 6,526,305 | B1 | * | 2/2003 | Mori ........................... 600/410 |
| 6,642,716 | B1 | * | 11/2003 | Hoogenraad et al. ....... 324/309 |
| 6,794,866 | B2 | * | 9/2004 | Ferrage et al. .............. 324/307 |
| 6,806,705 | B2 | * | 10/2004 | van Muiswinkel et al. . 324/307 |
| 6,815,952 | B1 | * | 11/2004 | Rose et al. .................. 324/307 |

OTHER PUBLICATIONS

P. Douek, et al.: Myelin Fiber Orientation Color Mapping; Aug. 1991; Book of Abstracts, vol. 2, Society of Magnetic Resonance in Medicine; p 919.

* cited by examiner

Primary Examiner—Louis Arana
(74) Attorney, Agent, or Firm—Fish & Richardson P.C.

(57) ABSTRACT

A new transform is disclosed, applying methods of group theory, with which the composition of a voxel of three channels comprising isotropic, single fiber and multiple fiber components can be determined, as well as the magnitude and orientation of the diffusion field. Asymmetries produced by experimental artifacts fall into channels distinct from the fiber channels, allowing their separation and a subsequent reduction in noise from the reconstructed fibers.

21 Claims, 28 Drawing Sheets

$$B = 500 g/mm^2$$

$B = 2500 s/mm^2$ $B = 5000 s/mm^2$

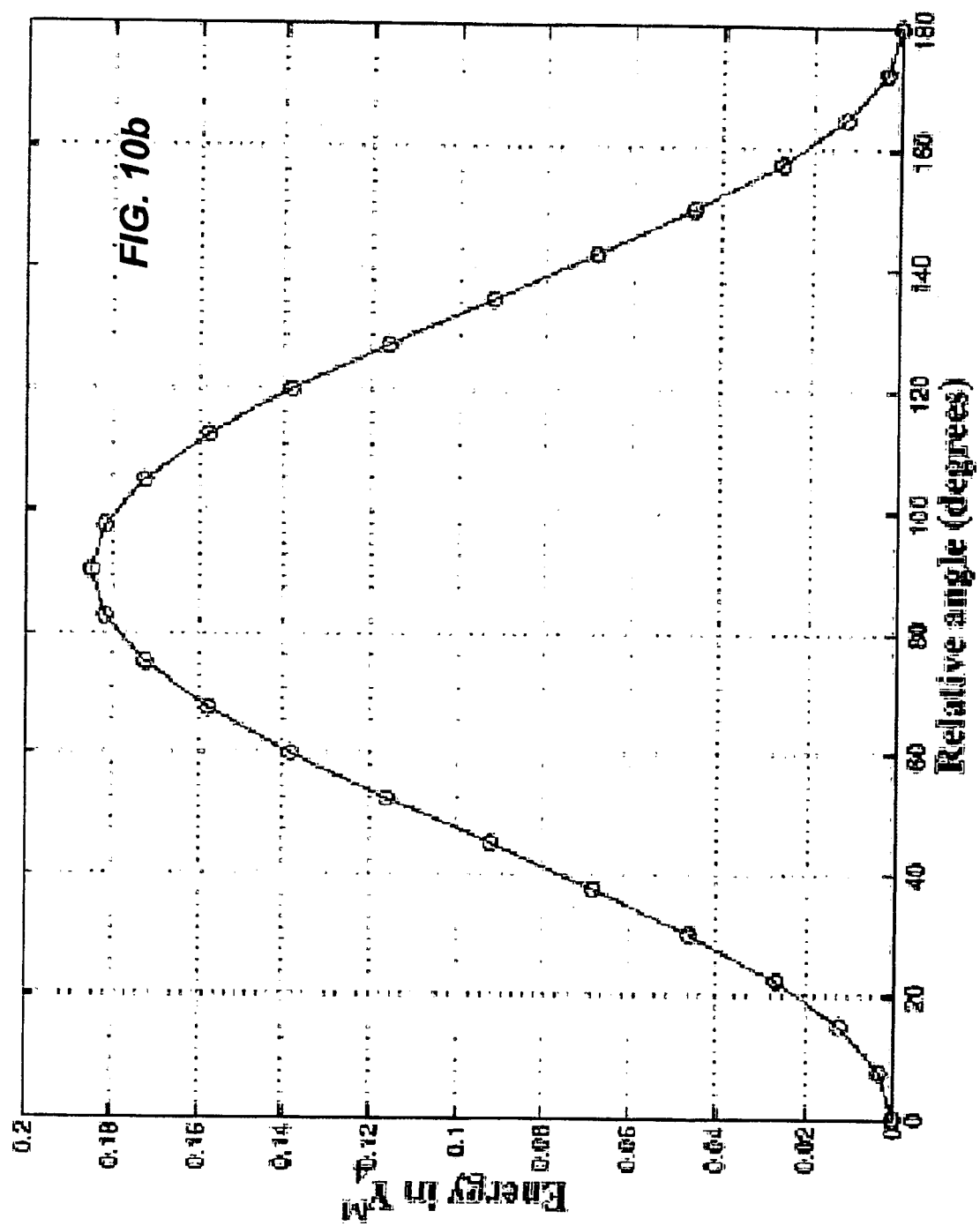

a b

L = 4
Multiple Fiber

L = 2
Single Fiber

L = 0
Isotropic

Odd orders

Even orders > 0

METHOD FOR ANALYZING MRI DIFFUSION DATA

This is a continuation-in-part of PCT application PCT/US02/12668 filed Apr. 6, 2002.

BACKGROUND OF THE INVENTION

Reference to Related Applications

This application claims priority to U.S. Provisional Application No. 60/282,033 filed Apr. 6, 2001, whose disclosure is hereby incorporated by reference in its entirety into the present disclosure.

I. Field of the Invention

The instant invention is directed generally to the field of magnetic resonance imaging (MRI), image display, image processing and image filtering to enhance structure and reduce noise. The present invention relates specifically to diffusion-weighted magnetic resonance imaging, more particularly to a quantitative and statistically robust numerical method for measuring anisotropic diffusion in an object, and most particularly to characterizing multiple fiber voxel data.

II. Description of Related Art

The background will be described with reference to related art publications listed in the attached appendix. All references cited are incorporated herein by reference.

Magnetic resonance imaging

Magnetic resonance imaging (MRI) is one of several approaches used to image physiological structures. For example, MRI has revolutionized radiological imaging of the internal structures of the human body, because of its noninvasiveness and no known health hazards attributed to its use.

Basically, MRI involves the exposure of tissue to a variety of different polarizing magnetic and radio-frequency electromagnetic fields. The tissue's atomic nuclei respond to the fields and are subsequently processed to produce an image of the specimen. Nuclei exhibiting magnetic moments (spins) align themselves with the polarizing field. Depending upon the field's strength and the magnetogyric constant of the specific nuclear species involved, the nuclei precess about the polarizing field at an angular frequency (Larmor frequency).

The spins exhibit a net magnetic moment in the direction of the polarizing field even though the magnetic components of the spins cancel each other in a plane perpendicular to the polarizing field. The net magnetic moment can be tilted by applying an excitation field perpendicular to the polarizing field and at a frequency near the Larmor frequency. The tilted magnetic moment comprises a transverse component rotating at the Larmor frequency in the plane perpendicular to the polarizing field. The magnitude and duration of the excitation field determines the extent to which the magnetic moment is tilted and the magnitude of the net transverse magnetic moment.

Once the excitation field is removed, an external return coil senses the field associated with the transverse magnetic moment, producing a sinusoidal output at the Larmor frequency and an amplitude proportional to that of the transverse magnetic moment. The net magnetic moment gradually reorients itself with the polarizing field when the excitation field is removed resulting in the amplitude of the return coil output decaying exponentially with time.

The rate at which the return coil output decays is dependent upon, and indicative of, the composition of the specimen. If the excitation field has a broad frequency band, the return coil output may include components associated with the transverse magnetic components of a greater variety of frequencies. A Fourier analysis of the output allows the different frequencies, indicative of different chemical or biological environments, to be distinguished. Employing an excitation field that has a narrow frequency band, excites only a relatively narrow band within a nuclear species, resulting in the transverse magnetic component and return coil output exhibiting a relatively narrow frequency band indicative of that band of the nuclear species. In the wide band, the contribution of particular spins to the return coil output is not dependent upon their location within the specimen. Therefore, the output does not indicate the location of components in the specimen. The frequency and decay of the output can be used only to identify components of the specimen.

In order to produce a spatial image of the specimen, gradients are established in the polarizing field. Although the direction of the polarizing field remains the same, its strength varies along the x, y, and z axes oriented with respect to the specimen. Varying the strength of the polarizing field linearly along the x-axis, causes the Larmor frequency of a particular nuclear species to vary linearly as a function of its position along the x-axis. With magnetic field gradients established along the y-axis and z-axis, the Larmor frequency of a particular species will vary linearly as a function of its position along these axes.

By performing a Fourier analysis of the return coil's output, the frequency components of the output can be separated. With a narrow band excitation field applied to excite a select nuclear species, the position of a spin relative to the xyz coordinate system can then be determined by assessing the difference between the coil output frequency and the Larmor frequency for that species. Thus, the MRI system can be constructed to analyze frequency at a given point in time to determine the location of spins relative to the magnetic field gradients and to analyze the decay in frequency to determine the composition of the specimen at a particular point.

Special equential operation of one or more main polarizing field coils, polarizing gradient field coils, rf excitation field coils, and return field coils results in generation and sensing of the fields required for proper operation of an MRI system. The same coil arrangement can be used to generate the excitation field and sense the return field. As described in U.S. Pat. No. 4,843,322 (Glover); U.S. Pat. No. 4,868,501 (Conolly); and U.S. Pat. No. 4,901,020 (Ladebeck et al.), different sequences have been developed for specific aspects of MRI system operation.

Production of angiograms is but one application of conventional MRI systems. A variety of pulse sequences and processing techniques have been developed for use in MRI angiography [U.S. Pat No. 4,516,582 (Redington); U.S. Pat. No. 4,528,985 (Macovsli); U.S. Pat No. 4,647,857 (Taber); U.S. Pat. No. 4,714,081 (Dumoulin et al.); U.S. Pat. No. 4,777,957 (Wehrli et al.); and U.S. Pat. No. 4,836,209 (Nishimura)]. Blood vessels are readily differentiated from surrounding tissue by the pulsatile flow of blood. For example, if the excitation field is pulsed at systole and diastole, the contribution of blood flow to the return field will differ, while the contribution of static tissue and bone to the return field will be the same. The contribution from the blood vessel is determined by subtracting one return from the other, canceling the static component.

Because neuronal tissue does not exhibit the flow-distinctiveness of blood vessels, MRI angiography systems and pulse sequences cannot be used to generate suitable images and conventional MRI systems and sequences used for general imaging of tissue and bone do not provide acceptable results.

Contrasting agents

The use of pharmaceutical agents to enhance the contrast of neural tissue relative to surrounding tissue in the images produced is one technique proposed for use in enhancing the imaging of neural tissue [e.g. PCT EP 91/01780 (Filler et al., WO 92/04916, 1992)]. Therein, a two-part contrast agent was injected, taken up, and transported, by the nerve of interest. The first part of the agent promoted neural uptake; the second the desired image. Injected into muscle, the agent undergoes axoplasmic flow in the nerve supplying that muscle, thereby tagging the nerve. The second part of the agent has a magnetically active component.

Because of the ability to image only a single nerve or nerve group, an increasing preference to avoid the use of invasive procedures whenever possible, and the typical reduction of the intensity of the imaged nerve, the use of contrast agents has certain limitations in neural imaging.

Anisotropy

MRI has been used somewhat successfully without contrast agents to map white matter nerve tracts in the brain. White matter coursing through gray matter tissue in the brain, unlike the surrounding gray matter, exhibits relatively high anisotropic diffusion. Moreover, in axonal pathways surrounded by myelin sheaths, water mobility is relatively high, while water mobility perpendicular to the tracts is low. [Douek et al., Myelin Fiber Orientation Color Mapping, BOOK OF ABSTRACTS, SOCIETY OF MAGNETIC RESONANCE IN MEDICINE, p. 910 (1991)]

Briefly, a plurality of perpendicular and parallel field gradient pulses (diffusion gradients), oriented relative to the white matter tracts to be imaged is used. Pulsed gradients change the received signal phase from all of the spins. The relative effect of these diffusion gradients is the canceling out of stationary spins. Spins moving from one spatial position to another in the time between the two diffusion gradients, on the other hand, experience changes in the frequency and phase of the spin magnetization. The net effect is a reduction in the received signal, which is greatest for spins diffusing the farthest between the two pulsed gradients.

Diffusion-weighted imaging

Thus, MRI is one of the most versatile non-invasive imaging techniques in biomedicine, providing functional as well as anatomical information. MRI can also provide images exhibiting quantitative information regarding motion of water molecules. Given the anisotropic nature of white matter, water will diffuse freely along a tract, but is restricted in its motion perpendicular to the tract. When the diffusion gradient is aligned with the tract, there is thus a greater reduction in signal than when the diffusion gradient is aligned perpendicular to the tract. Because this phenomenon is not exhibited by the surrounding gray matter tissue, the white matter tracts can be identified. MRI dealing with microscopic motion within a single voxel is referred to as diffusion weighted imaging (DWI).

The MRI sequence for DWI, where differences in intravoxel water motion (apparent diffusion coefficient, $D_{app}$) are treated as another contrast mechanism. This is an extension of the original Stejskal-Tanner sequence for measurement of molecular diffusion by nuclear magnetic resonance (NMR), which employed diffusion gradient pulses (time-dependent field gradient) to encode quantitative information for molecular motion (diffusion coefficient) into a signal intensity.

As noted above, intravoxel anisotropic water motion produces signal attenuation of DWIs dependent on the direction of the diffusion gradient pulses applied. This directional dependency, most conspicuous in the myelinated fibers, is likely due to anisotropic restriction of water diffusion. In contrast to conventional DWIs, where diffusion gradient pulses are applied to three axial directions simultaneously, DWIs obtained using diffusion gradient pulses applied to only one spatial axis are generally referred to as anisotropic.

While intravoxel isotropic water motion produces identical effects on signal intensity of anisotropic DWIs regardless of the direction of the diffusion gradient pulses, intravoxel anisotropic water motion affects signal intensity in a manner dependent on the angle of the direction of anisotropy with respect to the spatial axis in which the diffusion gradient pulses have been applied. Therefore, each anisotropic DWI can be considered the projection image of intravoxel anisotropic water motion. Each pixel of anisotropic DWIs contains the spatial information in three-dimensional resolution, but carries only one dimensional information regarding anisotropic water motion in space, resulting in image resolution that is inferior to resolution obtained where each pixel has three-dimensional information.

High angular resolution diffusion-weighted MRI

The sensitivity of the magnetic resonance (MR) signal to molecular diffusion provides the most sensitive non-invasive method for the measurement of local tissue diffusion characteristics (1). The basic effect from which diffusion information is derived is the signal diminution due to diffusive motions along the direction of an applied gradient field (2, 3). The fact that diffusion can have a directional dependence was recognized early on (4) but found a great resurgence of interest in the application to diffusion weighted imaging of human tissues, where inferences about tissue structure can be made from the directional dependence it imposes on the local diffusion. Anisotropic diffusion was first demonstrated in the brain by Moseley (5, 6) and has been used to study a variety of other tissues (7). The determination of anisotropy requires a reconstruction of the local apparent diffusion, $D_{app}$. If the diffusion is process has spatially homogeneous Gaussian increments, the directional dependence can be completely characterized by the diffusion tensor D that relates the signal loss along an applied gradient in an orthogonal Cartesian system defined by the imaging coordinate system to the diffusion along a direction in an arbitrarily rotated orthogonal system defined by the tissue (8). Reconstruction of local Gaussian diffusion can thus be posed as one of estimating the diffusion tensor (8), which, in principle, requires only 6 measurements plus an additional measurement for normalization (9). This technique is of particular interest in its application to the characterization of white matter tracts (10, 11).

However, it has long been recognized that the Gaussian model for diffusion can be inappropriate within the complex structure of human tissue (8, 12). One way in which this model can fail is the presence of multiple fiber directions within a single imaging voxel. Because the diffusion tensor model is no longer appropriate, the characterization of the diffusion in such voxels becomes problematic. A novel approach to this problem, proposed by Tuch (13), is to map $D_{app}$ at high angular resolution in order to more accurately detect variations in diffusion along different directions. This has been extended to a scheme by Wedeen (14) where measurements through a range of diffusion sensitivities are made. There remains, however, no method for characterizing the diffusion measured by these high angular resolution diffusion weighted (HARD) methods.

In view of the above discussion, it is evident that there exists a strong need for an effective method of reconstructing and characterizing three dimensional information from axial anisotropic DWI projection images. The present invention fulfills these needs and provides additional advantages that will be apparent from the detailed description hereinbelow.

SUMMARY OF THE INVENTION

Accordingly, an object of this invention is to provide a method and system for the computerized analysis of MRI data especially as it relates to visualizing white matter properties and/or structure.

The invention contemplates a method for identifying diffusion anisotropy without invoking the diffusion tensor formalism. The method comprises the collecting of a plurality of high angle resolution diffusion image data employing a diffusion-weighted stimulated echo spiral acquisition process. The method further contemplates computing the spherical diffusion variance of the diffusion data in each voxel by a spherical harmonic transform algorithm, identifying components in the three diffusion channels, wherein diffusion channels are broken down into direct sum subspaces representing isotropic, single fiber, and multiple fiber components, and wherein asymmetries produced by artifacts fall into channels impossible to reach by diffusion, thereby, providing a direct means of noise reduction within said channels as well as means for identifying artifactual effects. The method is also useful for determining magnitude and direction of diffusion by computing from the transform magnitude and phase.

Also contemplated is a method for characterizing multicomponent MRI images of multidirectional crossed fibers in a specimen by obtaining a plurality of high angular diffusion weighted images, each image obtained by applying a diffusion gradient pulse, and employing a simple spherical harmonic transform algorithm for identification of diffusion anisotropy based upon the variance of the estimated apparent diffusion coefficient as a function of measurement direction. The specimen can be white matter in the mammalian body.

Also contemplated is a spherical harmonic transform algorithm useful in characterizing diffusion anisotropy from measurement data collected by employing high angular resolution magnetic resonance imaging, said transform derived from mathematical group theory.

Further contemplated is computer software programmed to perform rapid electronic characterization of MRI images employing group theory and the spherical harmonic transform as described herein below.

BRIEF DESCRIPTION OF THE DRAWINGS

The foregoing summary, as well as the following detailed description of the invention, will be better understood when read in conjunction with the appended drawings. For the purpose of illustrating the invention, there are shown in the drawings, certain embodiment(s) which are presently preferred. It should be understood, however, that the invention is not limited to the precise arrangements and instrumentalities shown.

(a) Single fiber. The $D_{app}$ contains contributions only from the L=0 term (the sphere) and a more complex shape produced by the L=2 spherical harmonic components.

(b) The $D_{app}$ for two identical fibers oriented * relative to one another, contains contributions only from the L=0 and L=2 spherical harmonic components, as in (a), as well as a contribution from the L=4 component (bottom right). Note hat the four-lobe structure of $D_{app}$ in the equatorial plane is generated by the addition of the 4 positive red lobes and the 4 negative blue lobes of the L=4 component to the L=0 component sphere. The color scheme for the coefficients has red at maximum positive and blue at maximum negative, while for $D_{app}$ is max positive (red) to zero (blue).

Figure 5:
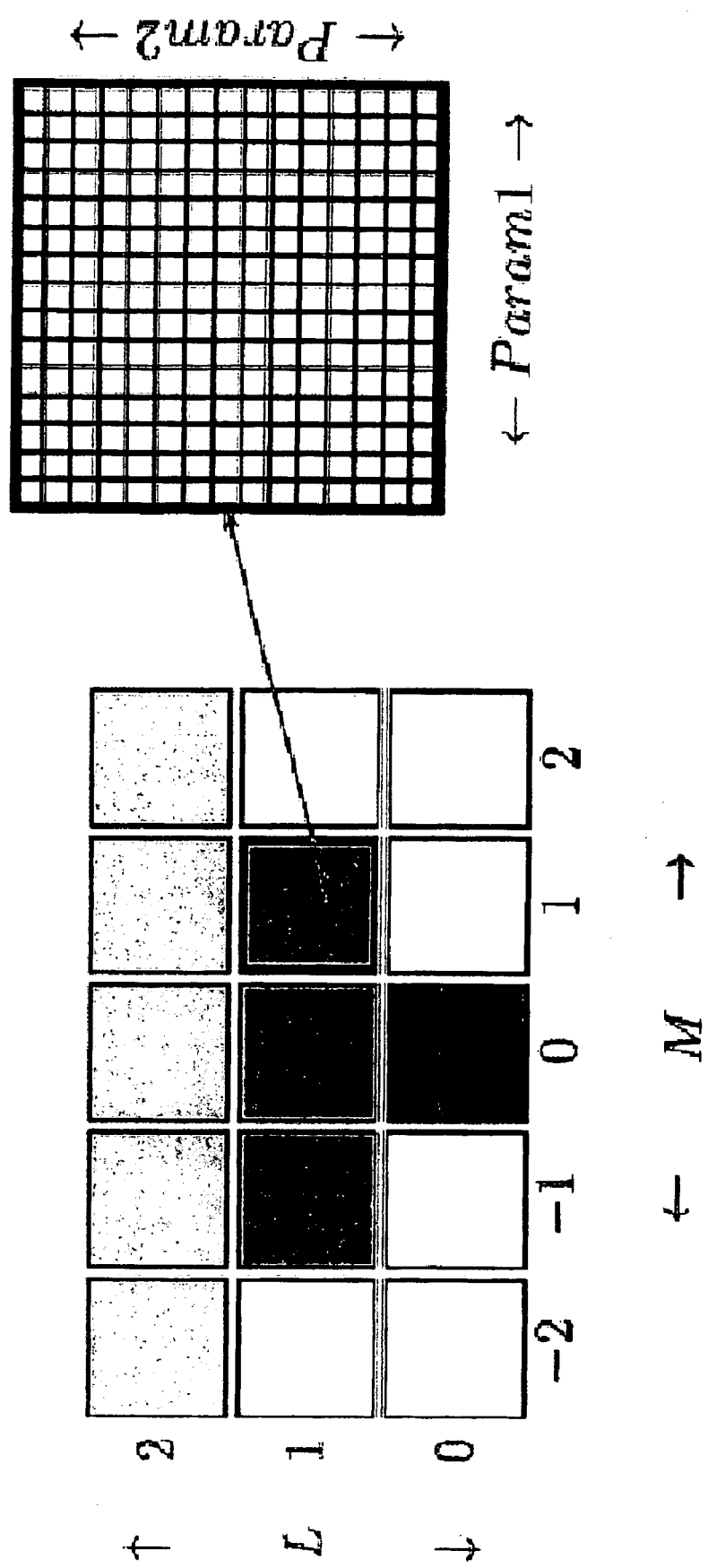

FIG. 5 is a graphical representation of the spherical harmonic transform. For each value of L, there corresponds 2 L +1 values of M:−L, . . . O, . . . ,L. The box at each (L,M) coordinate contains an array (upper right diagram) whose coordinates are varied parameters at the fixed values (L,M). The transform is identically zero for $|M|\geq L$ (blank boxes).

Figure 6:
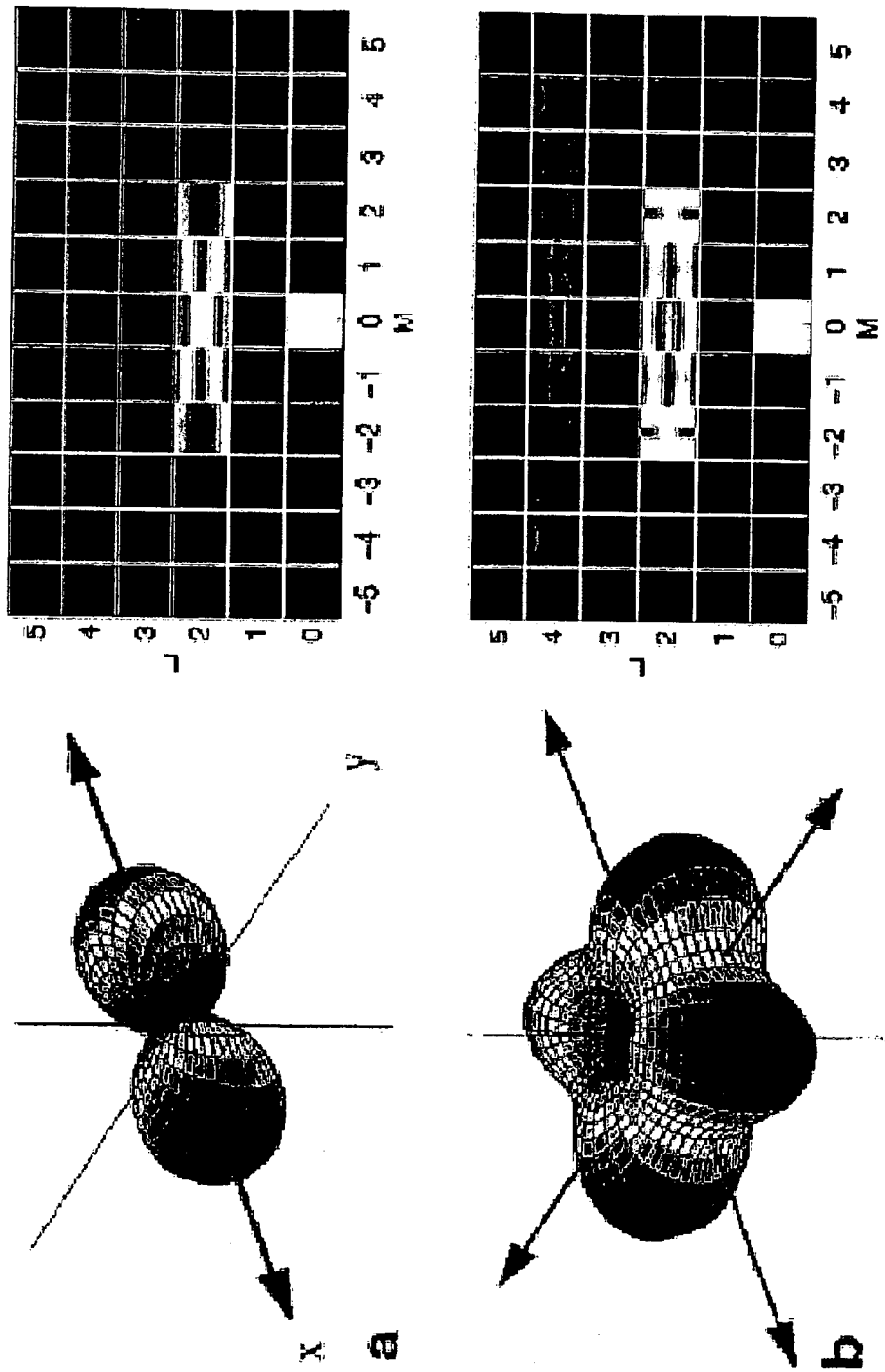

FIG. 6 shows rotational variations of the SHD. Reconstructed $D_{app}$ are on the left. The SHT coefficients are on the right with the varied parameters azimuthal ($\Delta\phi$) angle on the horizontal axis and the polar ($\Delta\phi$) angle on the vertical axis and displayed as described in FIG. 5. (a) Single fiber rotated through the full range of ($\phi,\theta$). (b) Two identical fibers oriented ($\Delta\theta,\Delta\phi$) relative to one another. (b left) $D_{app}$ for $(\Delta\theta,\Delta\phi)=(90°,0°)$. (b right) Spherical harmonic transform of two fibers with one fiber rotated through the full range of $(\Delta\theta,\Delta\phi)$. The angular variations are with respect to the first fiber which is fixed along x=0. The SHT in (a) and (b) shows that only L=0, 2 components arise from the single fiber and only L=0, 2, 4 arise from the multiple fiber. This is a consequence of the fact that rotations only mix M components.

Figure 7:
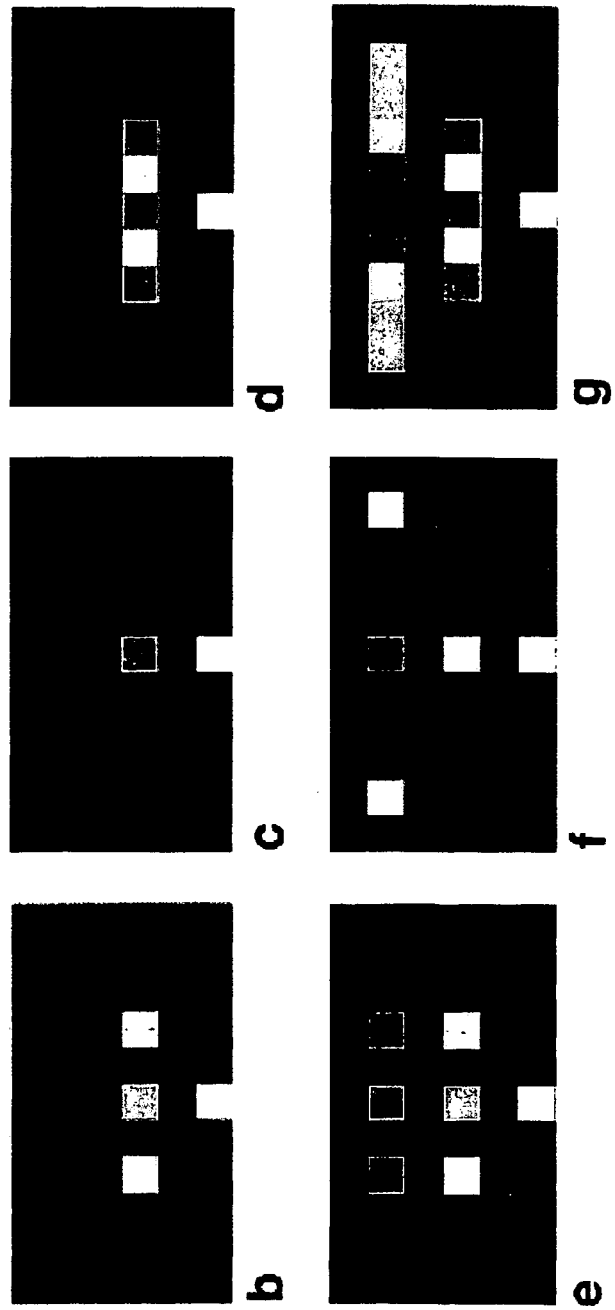
Figure 8A:
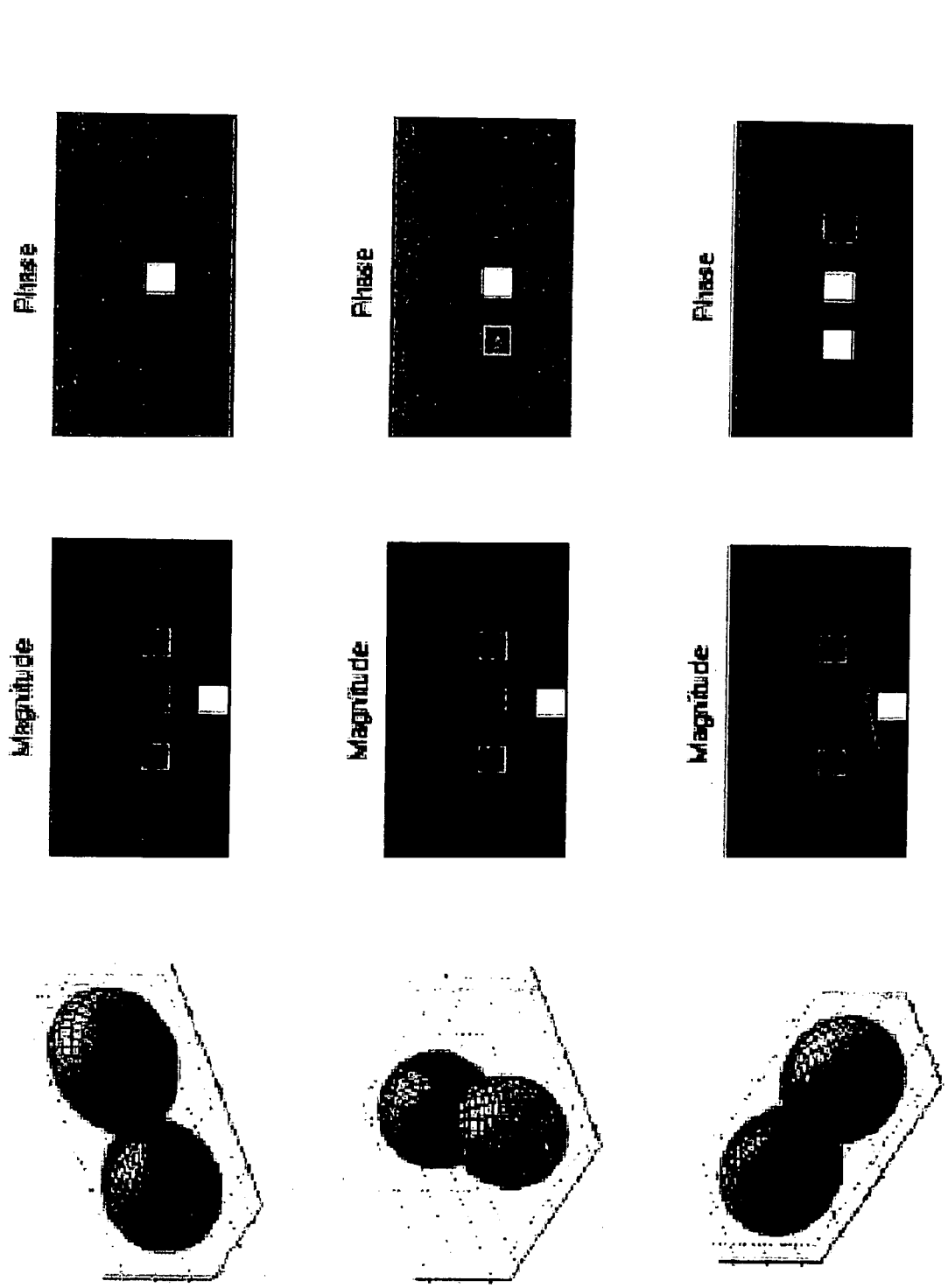
Figure 8B:
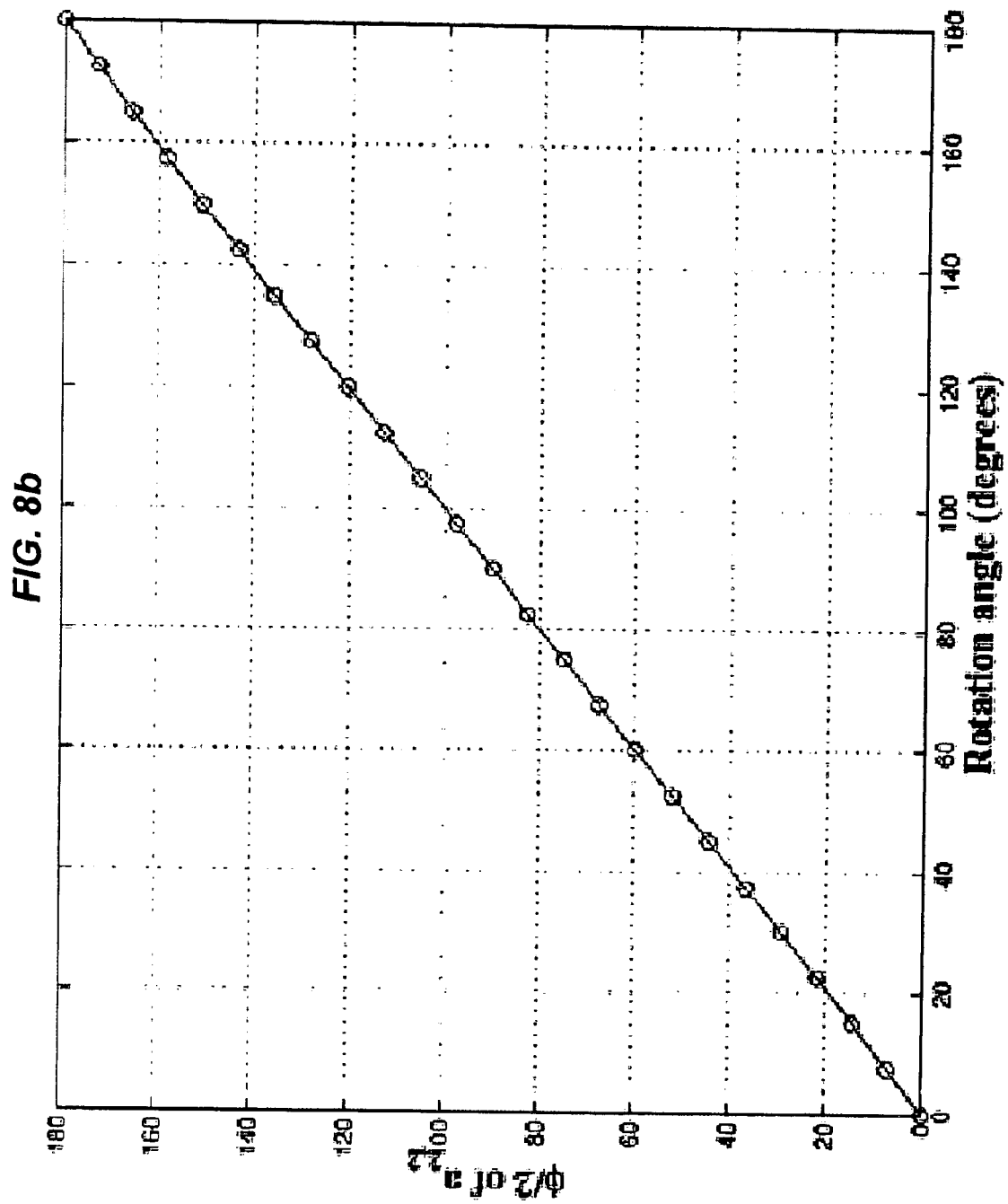
Figure 8C:
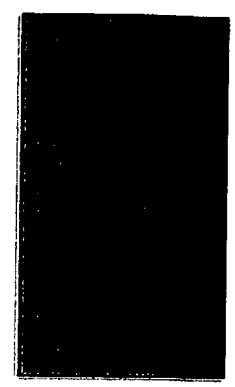
Figure 8C:
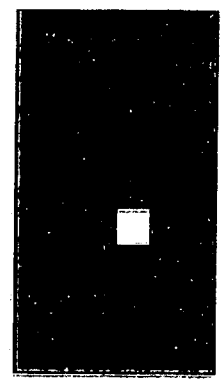
Figure 8C:
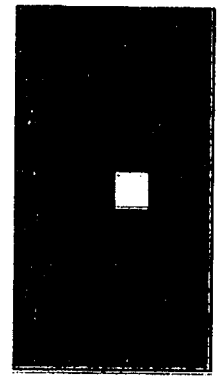
Figure 8C:
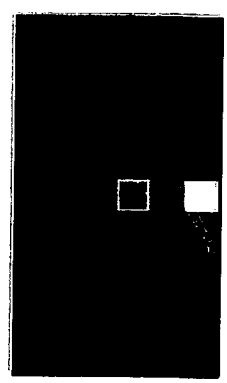
Figure 8C:
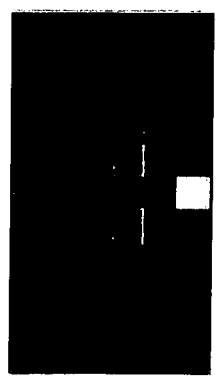
Figure 8C:
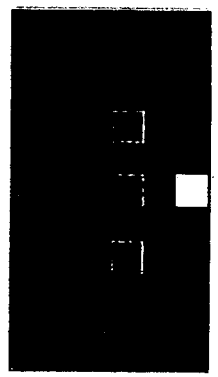
Figure 8C:
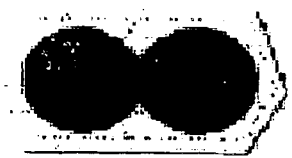
Figure 8C:
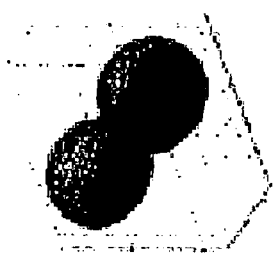
Figure 8C:
Figure 8D:
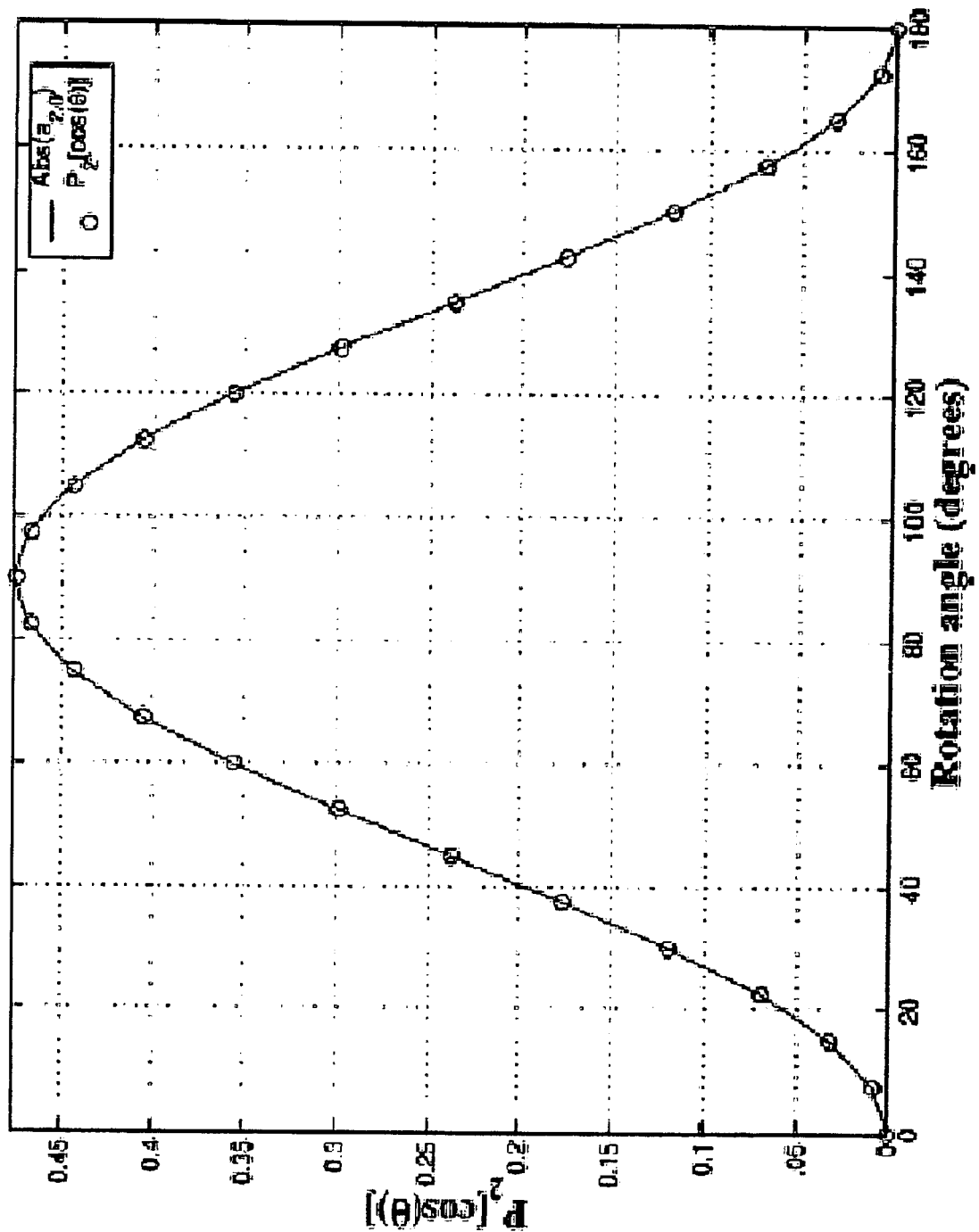
Figure 9A:
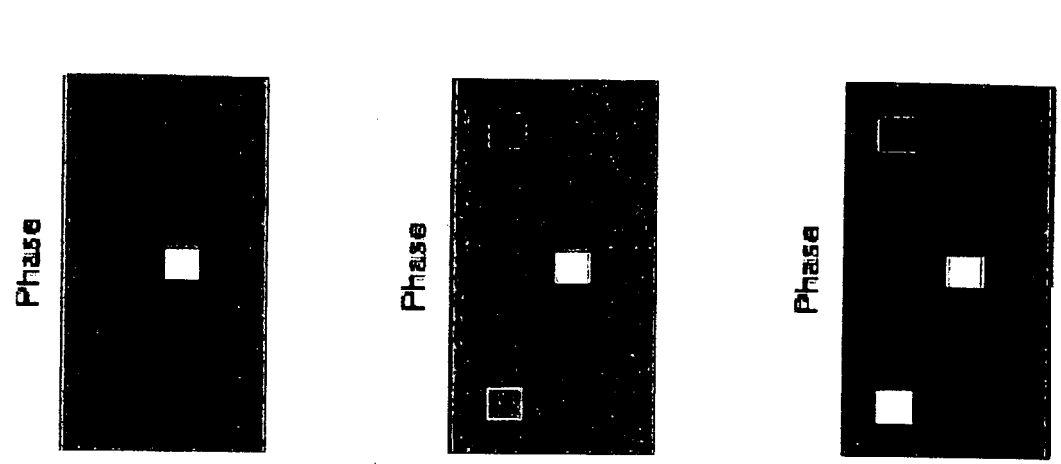
Figure 9A:
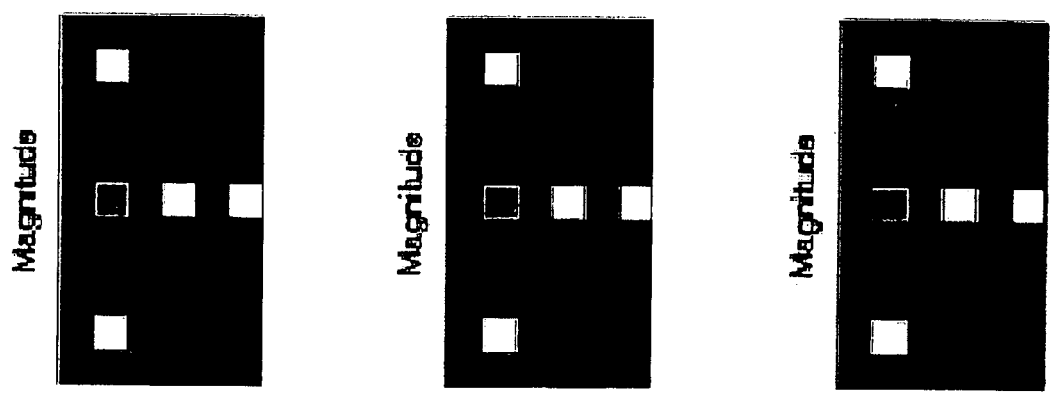
Figure 9A:
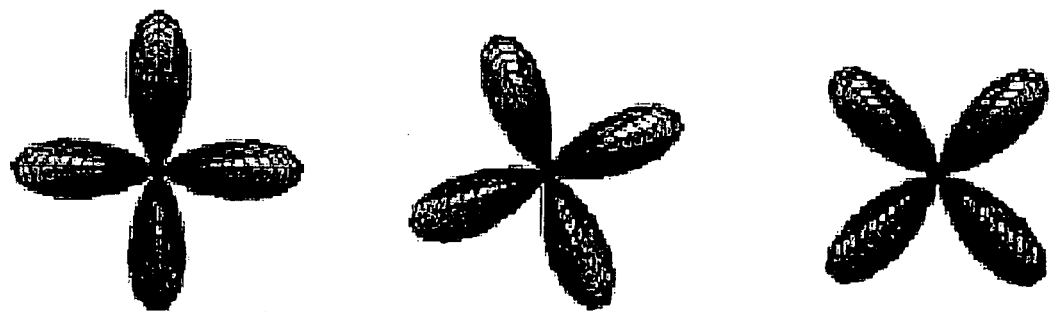
Figure 9B:
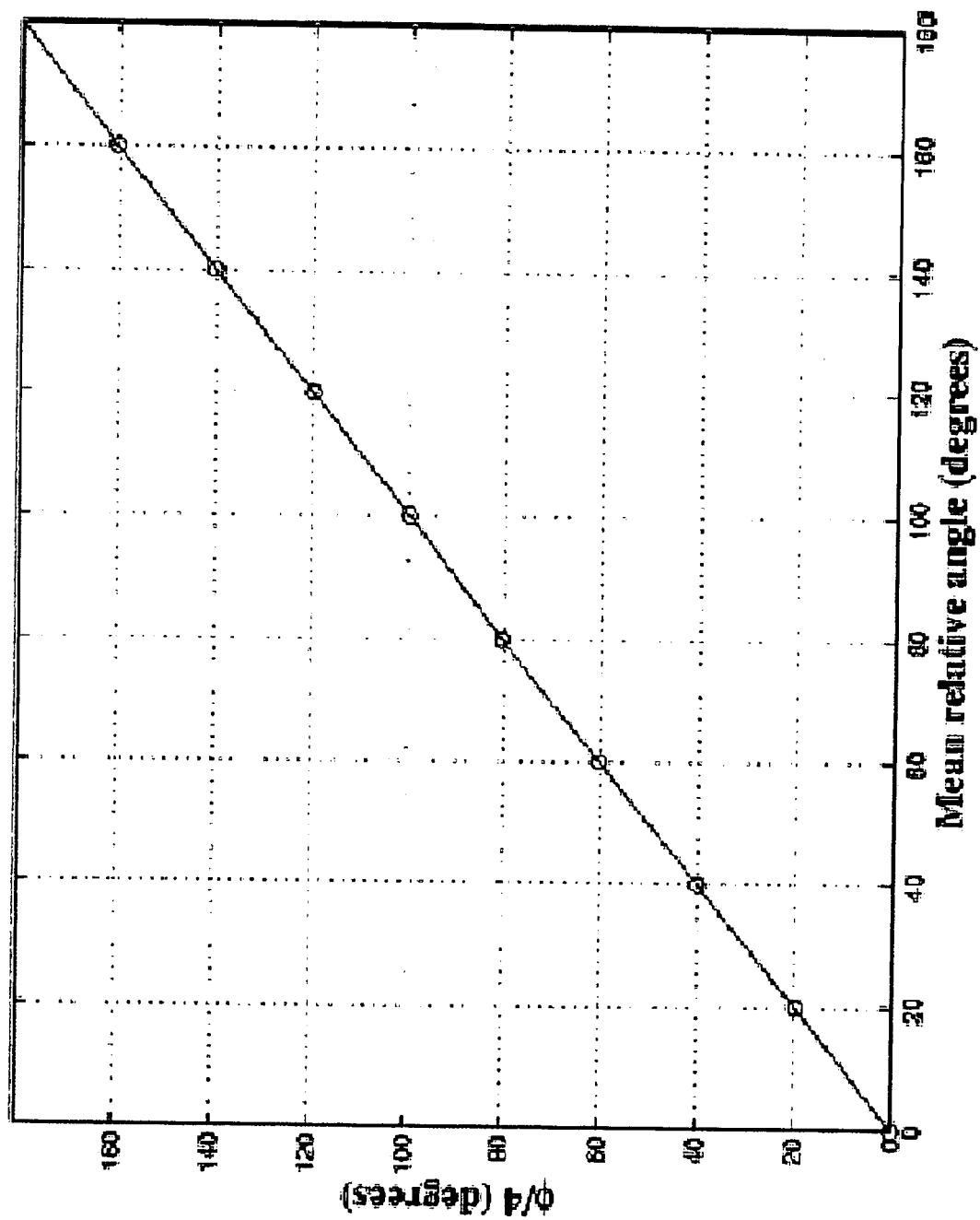
Figure 9C:
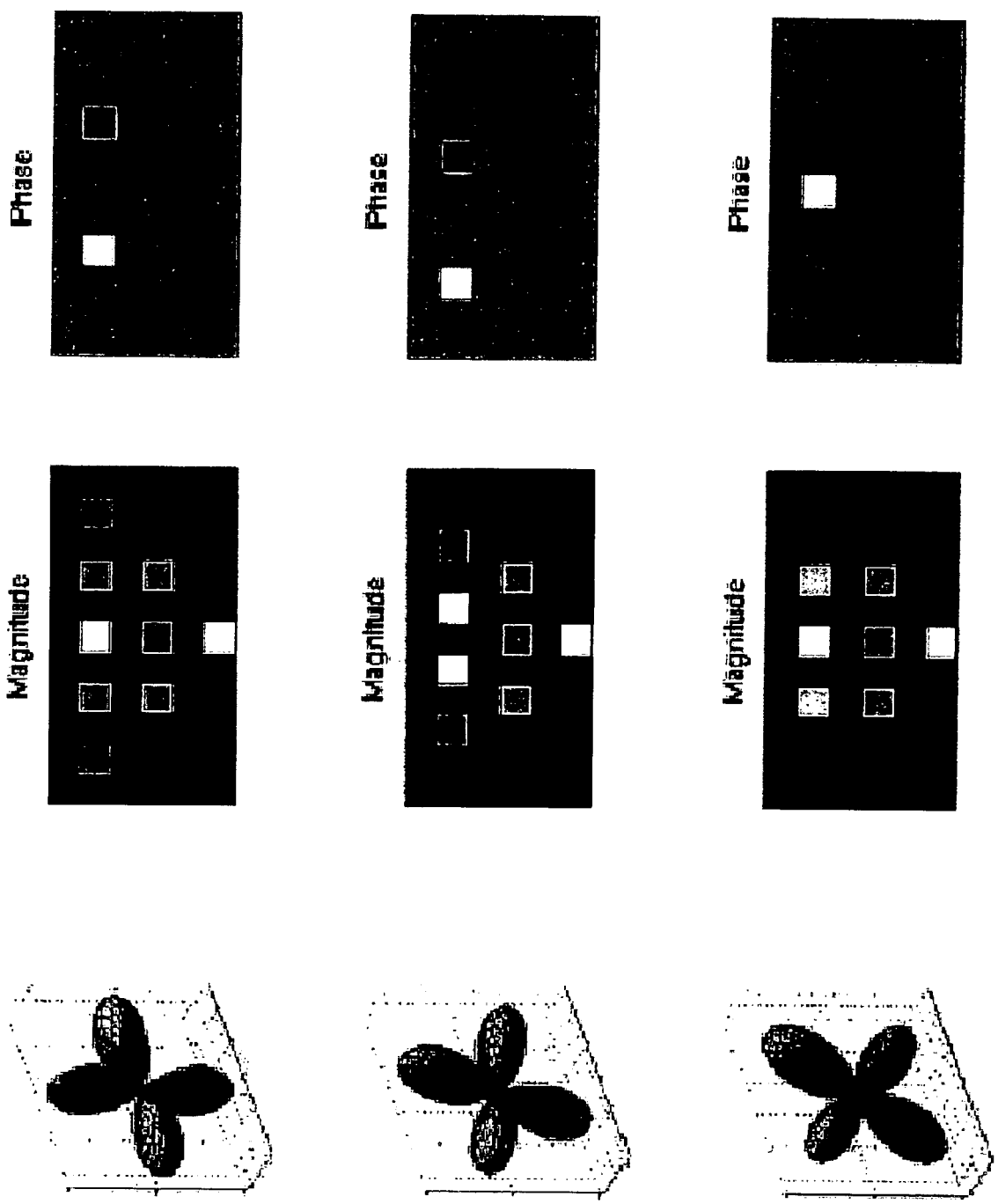
Figure 9D:
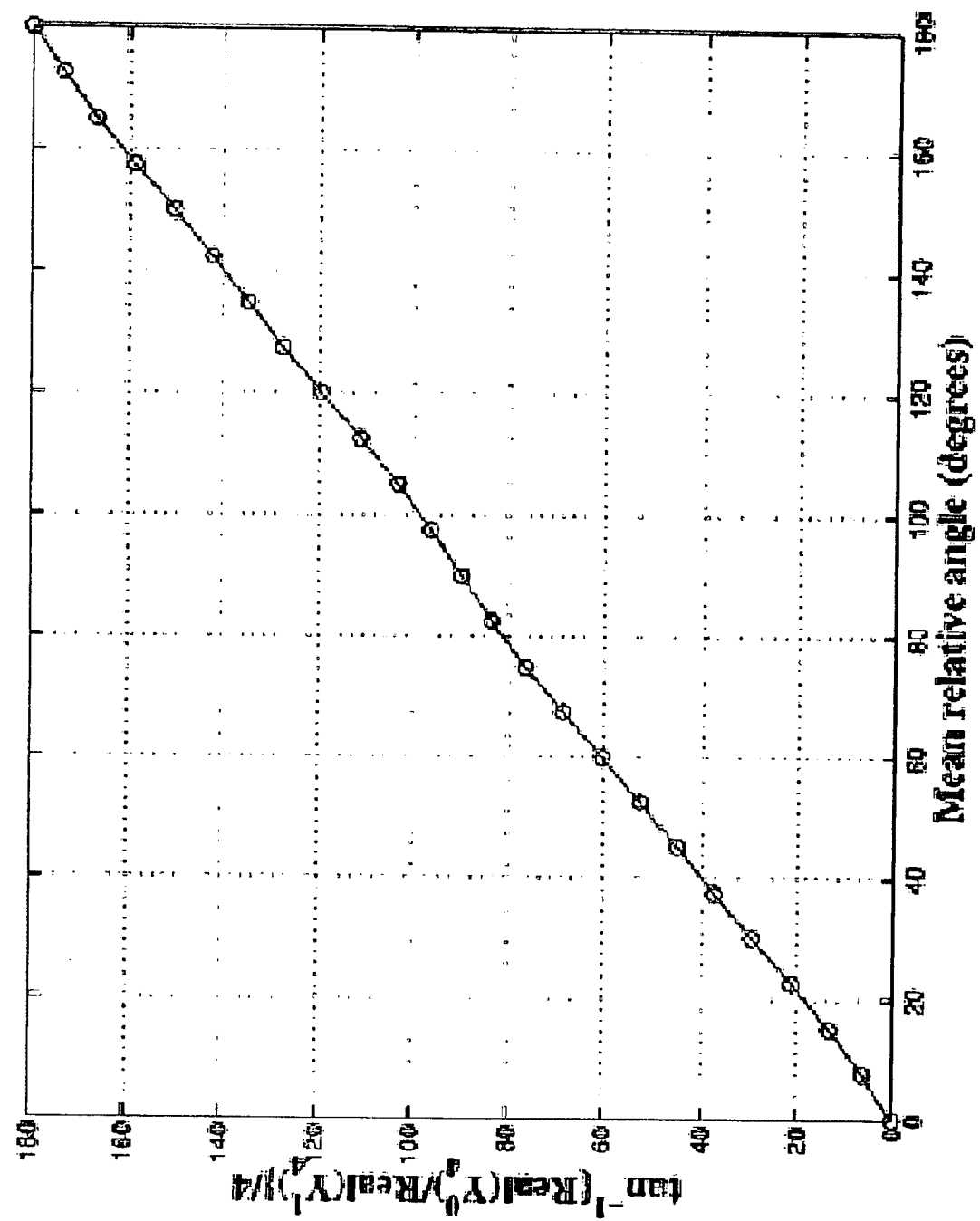
Figure 10A:
Figure 10A:
Figure 10A:
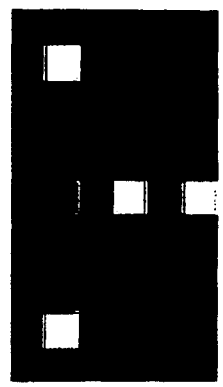
Figure 10A:
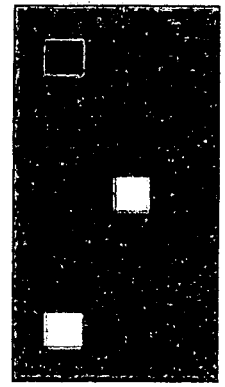
Figure 10A:
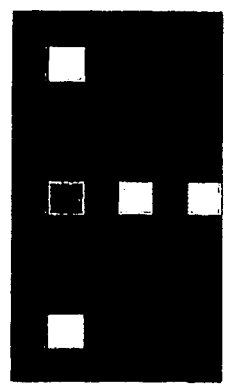
Figure 10A:
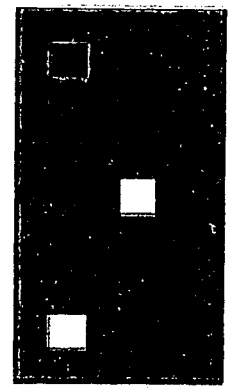
Figure 10A:
Figure 10A:
Figure 10C:
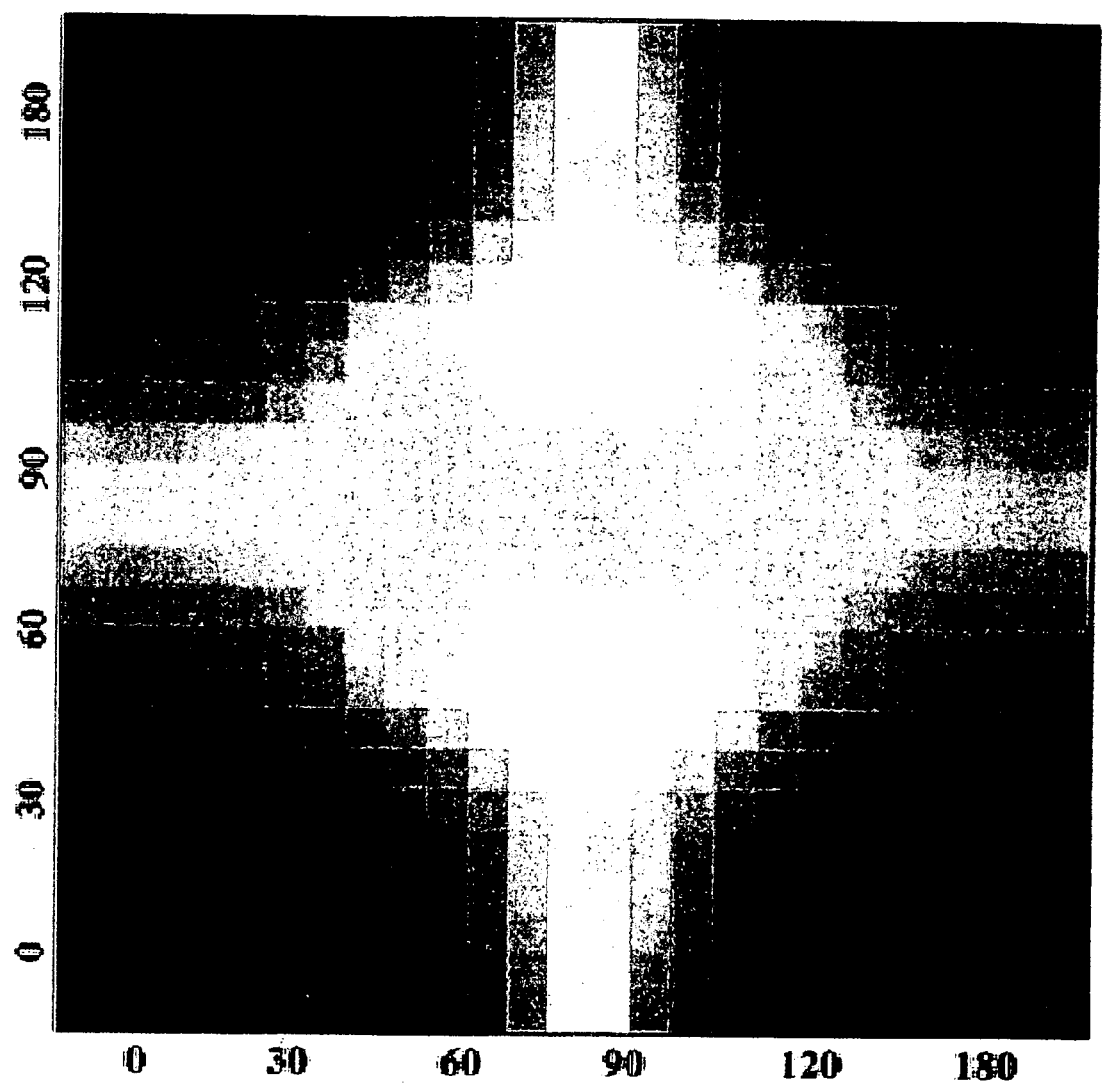
Figure 10D:
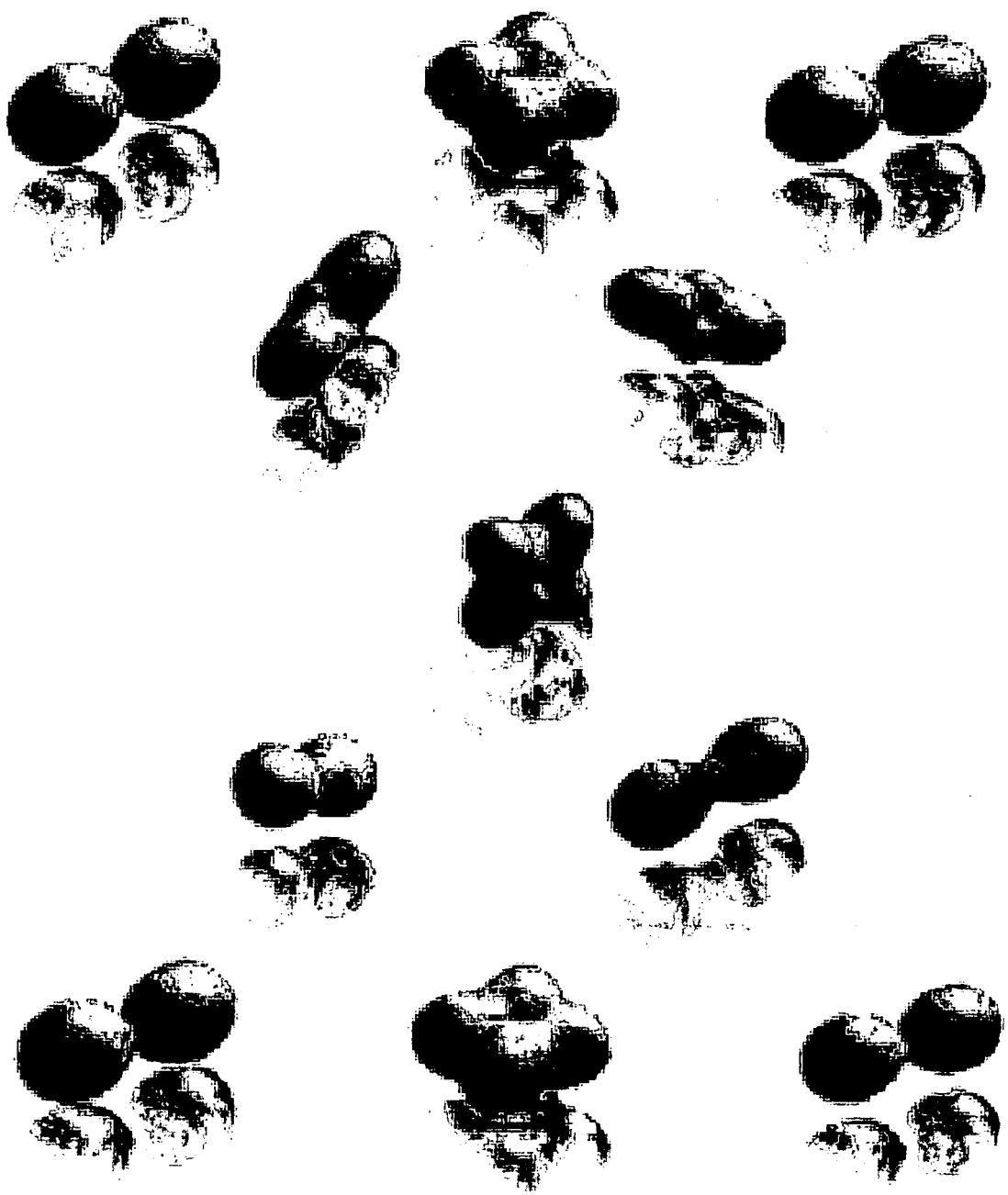

FIG. 7 shows that MR diffusion measurements are sensitive only to the absolute value of the direction: motion in x has the same effect as motion in −x. This imposes a projective symmetry on the measurements so that antipodes on the measurement sphere (Top) are identical. (Middle b–d) Projective subspace of a single fiber. (Bottom e–g) Projective subspace behavior of the coupling term.

(Top) Antipodes on the measurement sphere (red dots). (Middle)(a) Single fiber in the equatorial plane ($\theta=90°$). Only the M=0, 2 components of the L=2 channel contribute. (b) Single fiber oriented along the x axis ($\theta=0°$). Only the M=0 component of the L=2 channel contributes. (c) Single fiber oriented at ($\theta=45°$, $\phi=0°$). All of the M components of the L=2 channel contribute. (Bottom)(d) SHD components for two identical fibers oriented at $\Delta\theta,=90°$ in the meridian plane ($\phi=90°$). Only the even $|M|\leq 2$ components of the even L components contribute. (e) SHD components for two identical fibers oriented at $\Delta\phi_r=90°$ in the equatorial plane. Only the M=0, 4 components of the L=4 channel contribute. (f) SHD components of the coupling term for two identical fibers oriented at $\gamma=90°$ with the first fiber oriented along $(\phi, \theta)=(45°, 90°)$ and the second tilted second in the meridian plane $(\phi, \theta)=(135°, 45°)$. All M components of the even L components now contribute.

FIG. 8 depicts single fiber rotations. (Top a, b) Single fiber azimuthal rotation. Rotations in the equatorial plane produce only phase changes. (Bottom c, d) Single fiber polar rotation. Rotations in the meridian plane produce only magnitude changes.

(a) Single fiber fixed in the equatorial plane $(\theta=90°)$, at three different azimuthal angles of rotation: $\phi=(0°, 45°, 90°)$. The magnitudes of the components remains unchanged, but the phase is altered.

(b) The phase $\phi/2$ of the coefficient $\alpha_{2,2}$ of the SHT shown for the fiber in the equatorial plane $(\theta=\pi/2)$ rotated through the range of orientations in the equatorial plane $0 \leq \phi \leq 180°$.

(c) Single fiber fixed in the meridian plane $(\phi=90°)$, at three different polar angles of rotation: $\theta=(0°, 45°, 90°)$. The magnitudes of the components are redistributed amongst the available L=2 channels (M=−2, 0, 2) but the phase remains unchanged. (Bright white pixels are numerical noise artifacts aliased from 0 to $\pi$)

(d) The magnitude of the coefficient $\alpha_{2,0}$ of the SHT (solid line) for a fiber in the meridian plane $(\phi=0)$ rotated through the range of orientations in the meridian plane $0 \leq \theta \leq 180°$. The circles are the function $cP_2(\cos\theta)$ (with a scaling factor c) and show exact correspondence with the magnitude variations of $\alpha_{2,0}$.

FIG. 9 is about double fiber rotations. (Top a–b) Double fiber azimuthal rotation. Rotations in the equatorial plane produce only phase changes in the coupling term. (Bottom c–d) Double fiber polar rotation. Rotations in the meridian plane produce only magnitude changes in the coupling term and a mixing of energy amongst the M components.

(a) The coupling term for two identical fibers in the equatorial plane $(\theta=\pi/2)$ at a fixed orientation of 90° relative to one another, rotated relative to the laboratory coordinate system through $\phi=(0, \pi/16, \pi/8)$ radians. The shape of the coupling term does not change, but its orientation relative to the laboratory changes. As a result, the phase of the coefficients changes, but their magnitude stays the same.

(b) The phase $\theta/4$ of the coupling term for two identical fibers in the equatorial plane $(\theta=\pi/2)$, at a fixed orientation of 90° relative to one another, rotated relative to laboratory coordinate system through a range $0 \leq \phi \leq \pi$ radians.

(c) The coupling term for two identical fibers in the meridian plane $(\theta=\pi/2)$ at a fixed orientation of 90° relative to one another, rotated relative to the laboratory coordinate system through $\phi=(0, \pi/16, \pi/8)$ radians. The shape of the coupling term does not change, but its orientation relative to the laboratory changes. As a result, the relative magnitude of the components with L changes, but the phase stays the same.

(d) The relative magnitude of the SHD components of the coupling term for two identical fibers in the meridian plane $(\phi=0)$, at a fixed orientation of 90° relative to one another, rotated relative to the laboratory coordinate system through a range $0 \leq \theta \leq \pi/2$ radians. The angle determined by the changing magnitudes in the even and odd M channels is proportional to the orientation: $\phi/4=\tan^{-2}(Y_4^0/Y_4^2)$.

FIG. 10 shows double fiber relative rotations and the Fractional Multifiber Index.

(a) The coupling term for two identical fibers in the equatorial plane $(\theta=\pi/2)$ at three different relative orientations $\Delta\phi=(0, \pi/4, \pi/2)$ radians relative to one another, with the mean angle between them fixed relative to the laboratory coordinate system $\phi=(0, \pi/16, \pi/8)$ radians. The shape of the coupling term does not change, but its size changes. As a result, the magnitude of coefficients of the coupling coefficient grows with increasing relative angle, but the phase stays the same.

(b) The energy in the L=4 component of the SHD components of the coupling term for two identical fibers in the meridian plane $(\phi=0)$, for a range of relative orientations $0 \leq \Delta \leq \pi$, for a fixed mean angle relative to the laboratory coordinate system (0°). The maximum magnitude occurs for $\Delta=90°$, ie., when the fibers are perpendicular.

(c) (Bottom Left) The Fractional Multiplier Index (FMI) for a simulation of two identical fibers for a full range of relative azimuthal $\Delta\phi$ and polar $\Delta\theta$ orientations between the fibers, sampled in increments of 7.2° in both $\Delta\phi$ and $\Delta\theta$. (Bottom Right) A few of the corresponding local diffusion $D_{app}(\phi,\theta)$.

Figure 11:
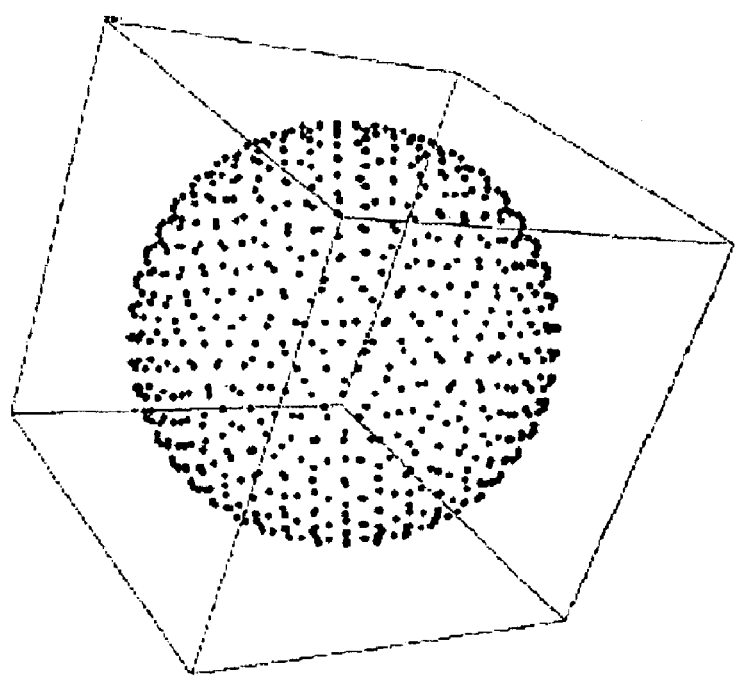
Figure 11:
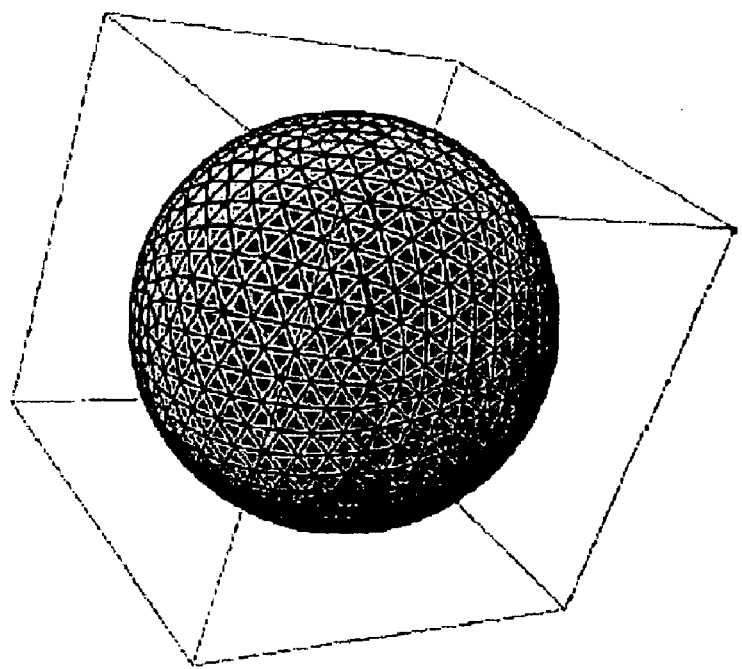

FIG. 11 shows diffusion encoding directions generated by the pulse sequence are spherical tessellations of an icosahedron of user-specified order (shown here for clarity is the fifth order tessellation).

Figure 12:
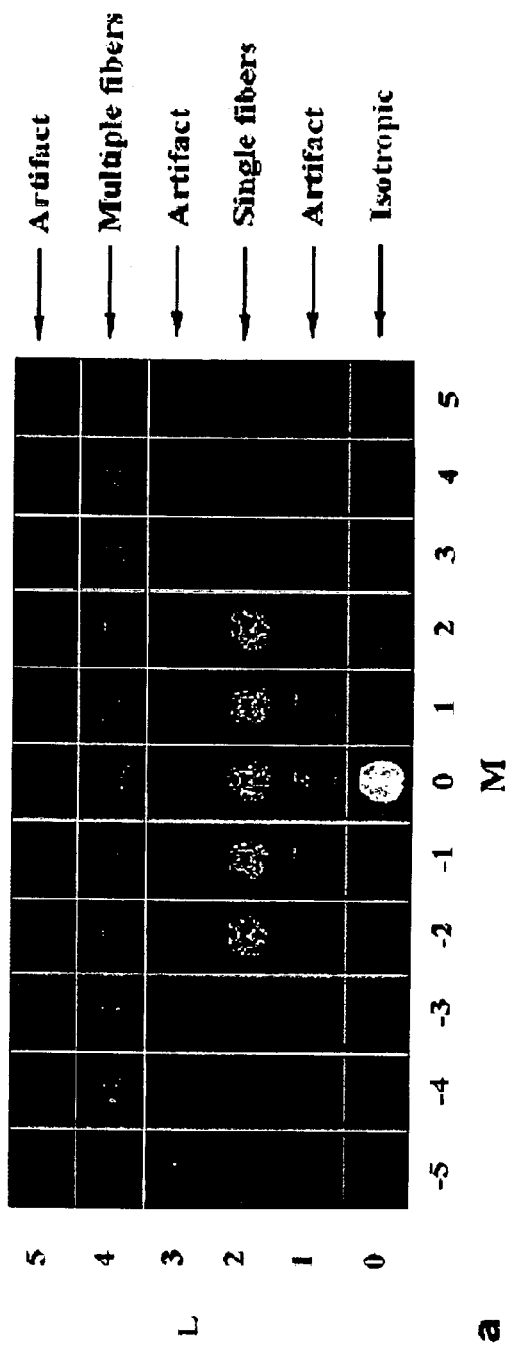
Figure 12:
Figure 12:
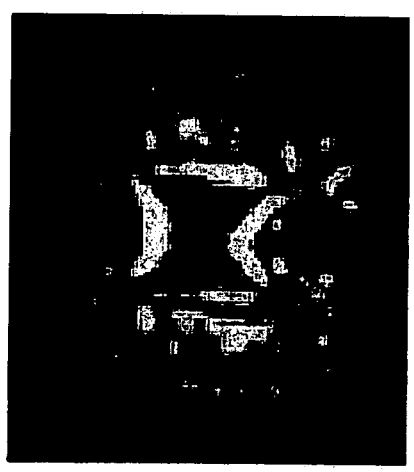
Figure 12:
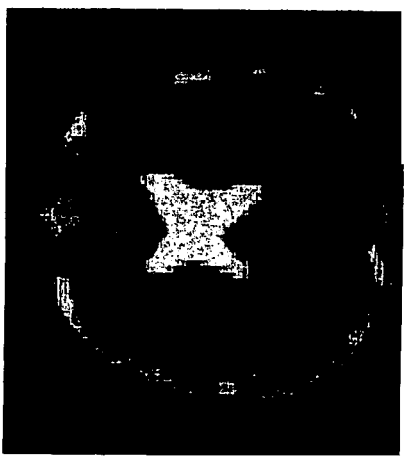

FIG. 12 demonstrates spherical harmonic transform and the separate fiber channels it produces. (a) Compound spherical harmonic transform components of HARD data collected on a normal human volunteer with b=3000 s/mm² and 43 diffusion encoding directions. As predicted, the energy is indeed confined to the L=0, 2, 4, except for the eddy current artifacts appearing at (L, M)=(0, 1).

Figure 13:
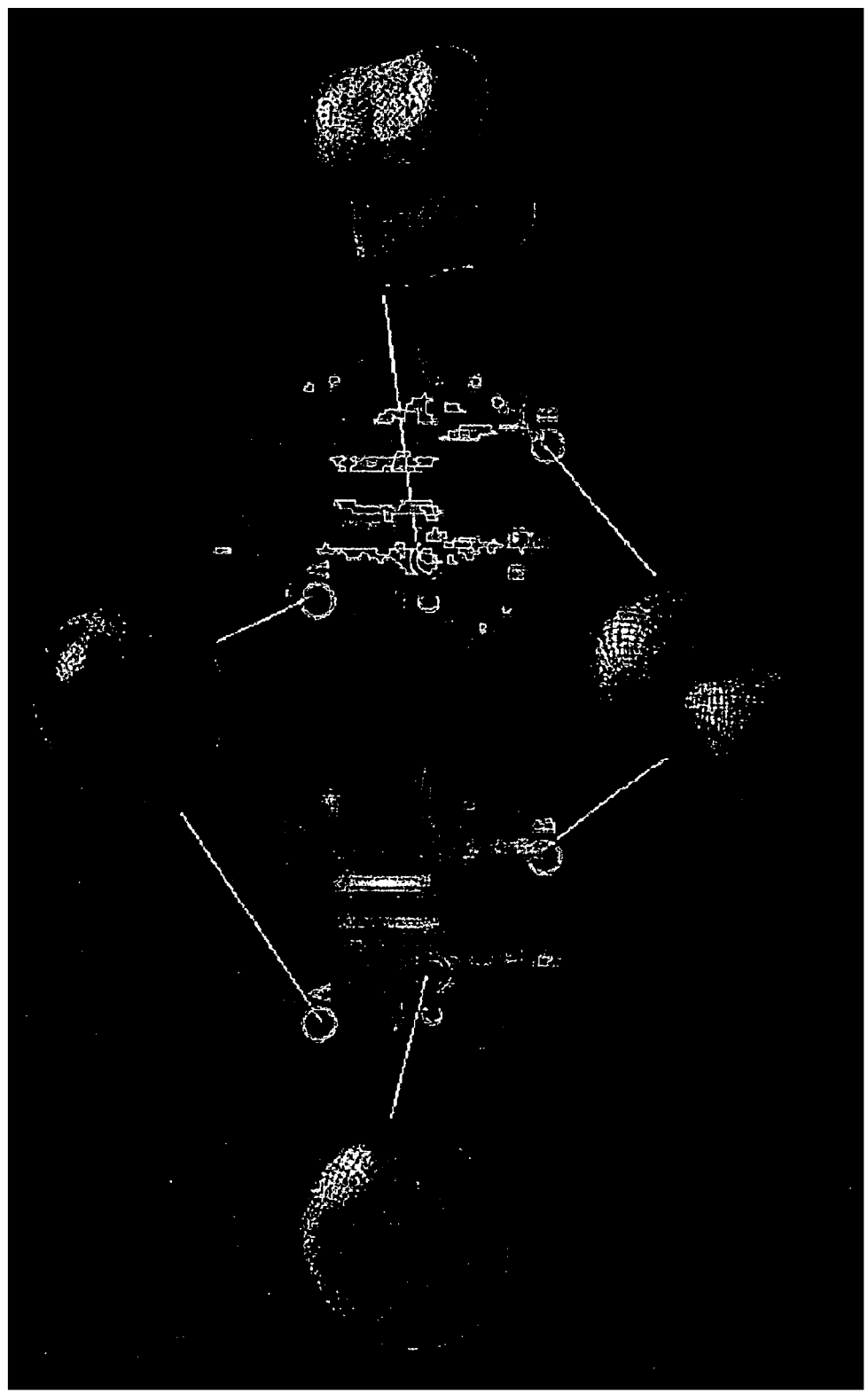

FIG. 13 shows the shape of $D_{app}$ estimated from the fiber channels in FIG. 12. (Top Left) Single fiber channel (greyscale) overlayed in color with multifiber channel (FMI>0.4) (color scale). (Top Right) Greyscale image is relative anisotropy index determined from diffusion tensor calculation from same data. In circles, there are three points from the isotropic (A), single fiber (B) and (C) multiplier channels for which $D_{app}$ is (colored shapes) reconstructed from all three SHT components L=0, 2, 4. The gray matter voxel (A) is essentially isotropic, so that $D_{app}$ is a sphere and unaffected by the inclusion of L=2, 4. The single fiber voxel (B) has the characteristic peanut shape, which is unaffected by the inclusion of L=4. The voxel in (C) requires L=2, 4 to represent $D_{app}$, which in this case is consistent with two identical but perpendicular fibers. The DTI reconstruction (c), on the other hand, can only accurately reconstruct the isotropic and single fiber channels. Both, (A) isotropic and (B) single fiber voxels are evident, but (C) multiplier channel appears black, being the extreme case of two fibers crossed at 90°.

Figure 14:
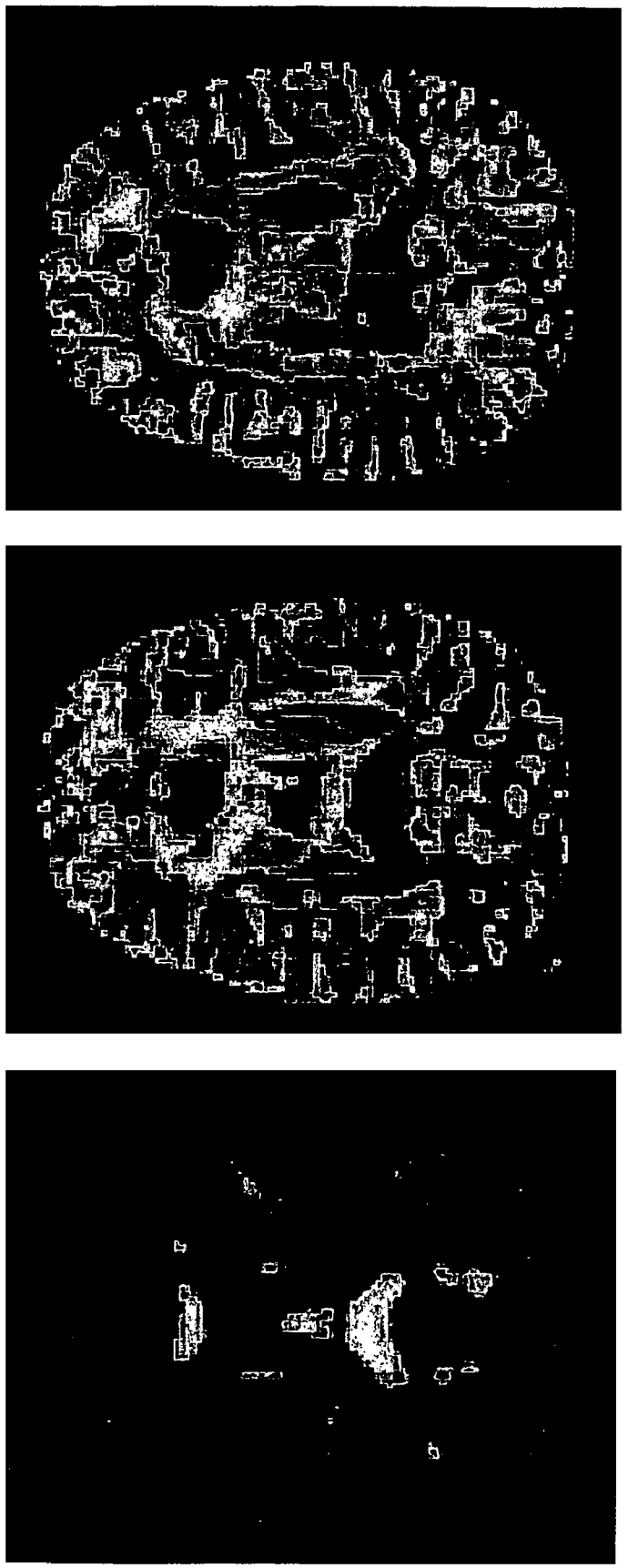

FIG. 14 shows fiber magnitude and orientation. (A) Magnitude of single fiber channel, representing the presence of single fibers, (B) map of estimated $\theta$, and (C) map of estimated $\phi$.

Figure 15:
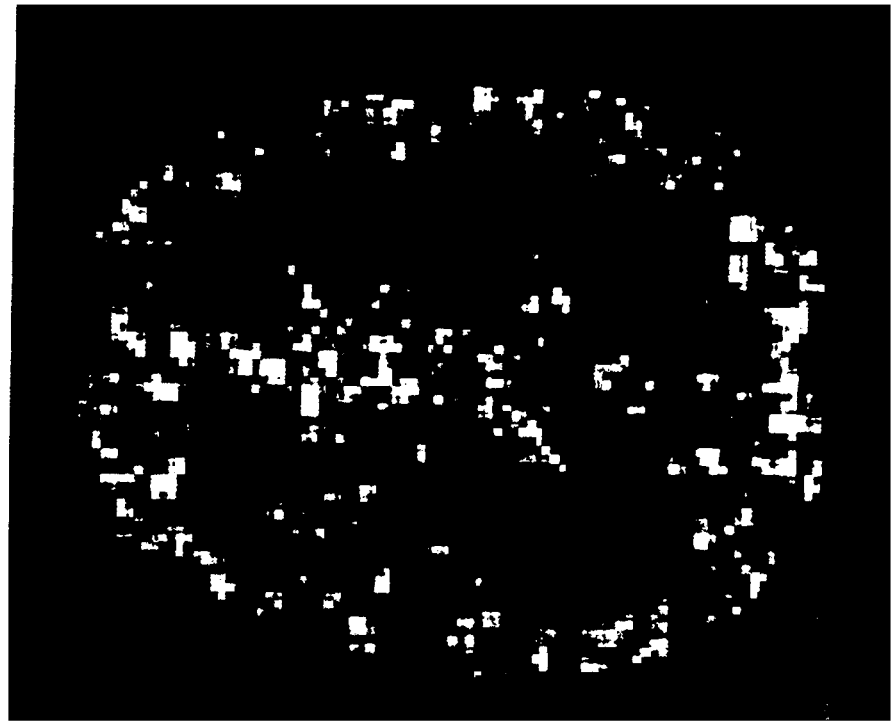
Figure 15:
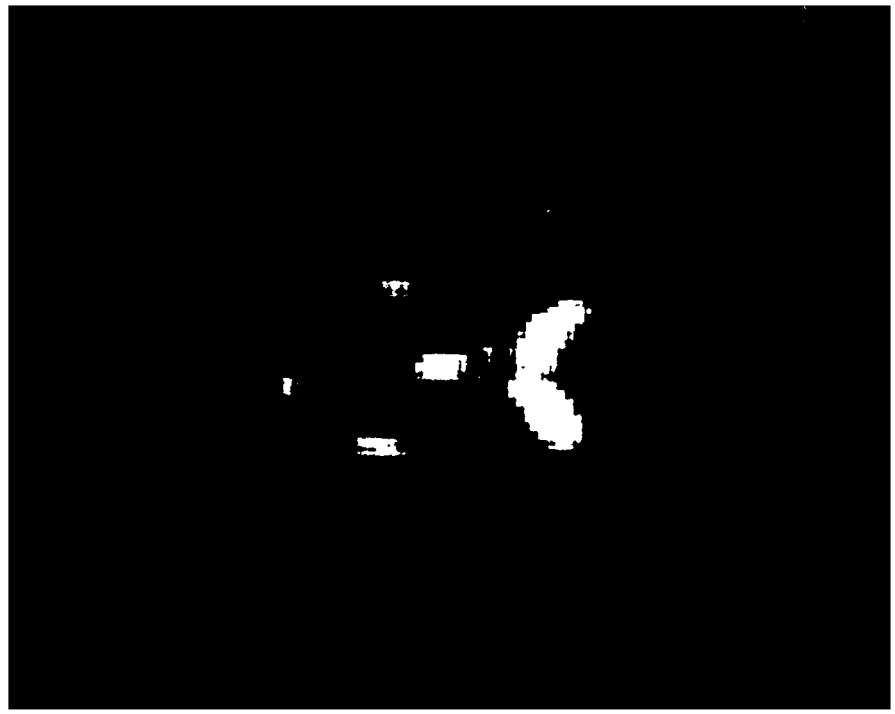

FIG. 15 shows: (Left) a white matter map reconstructed by adding the energy in the L=2, 4 channels, and (Right) a map made from the energy in the odd order components (L=1, 3, 5) showing little structure. These images are not on the same scale, but scaled independently for display.

Figure 16:
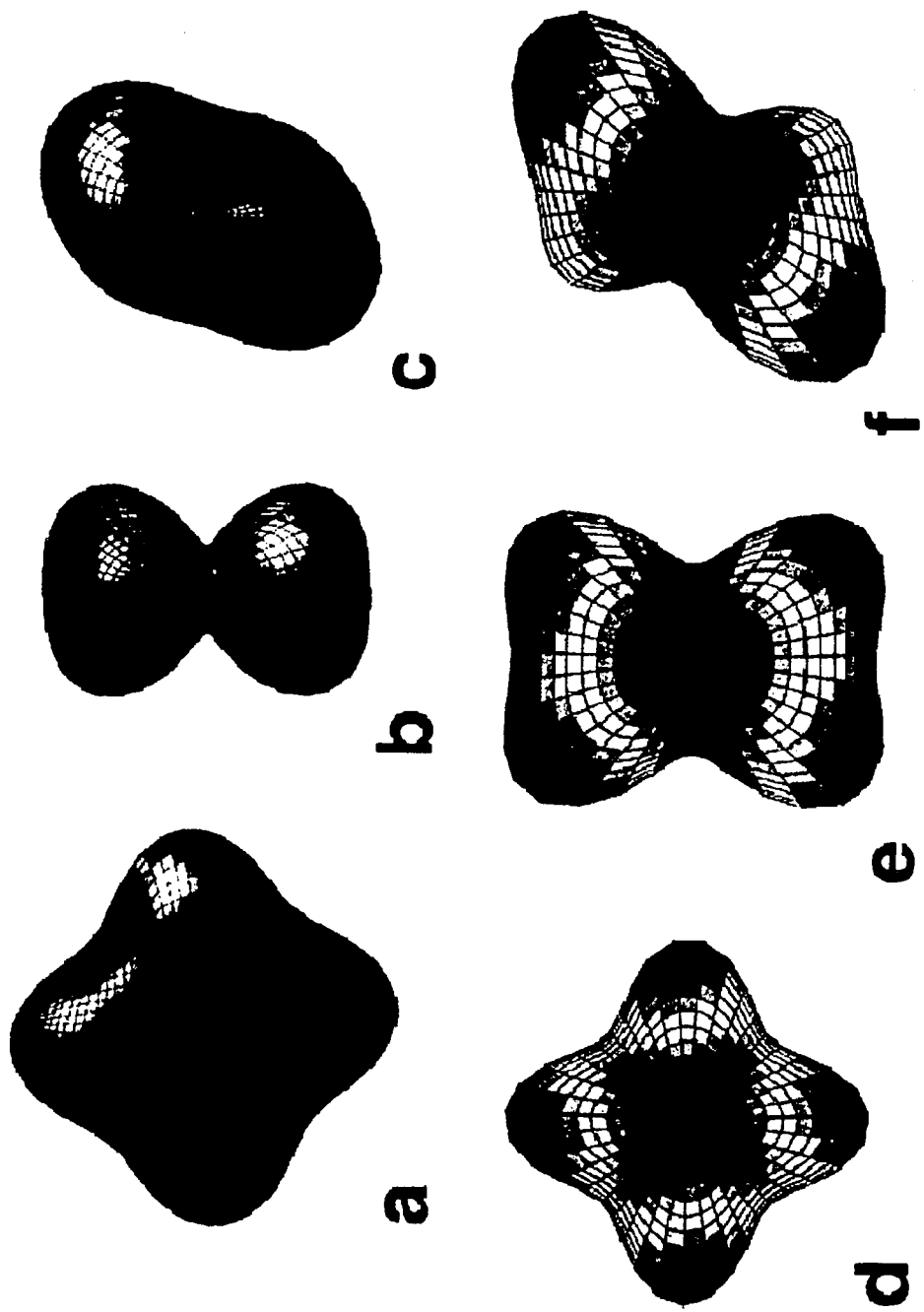

FIG. 16 represents evidence of consistency with the two-fiber model. $D_{app}$ measured from multifiber channel in FIG. 12 (top) and simulated (bottom) for $(1-r)f_1=f_2$, $d\phi=90°$, f.=2f$_2$, dφ=90°,f.=2f$_2$, dφ=75°. The shapes have been interpolated from the diffusion directional sampling for clarity.

Figure 17:
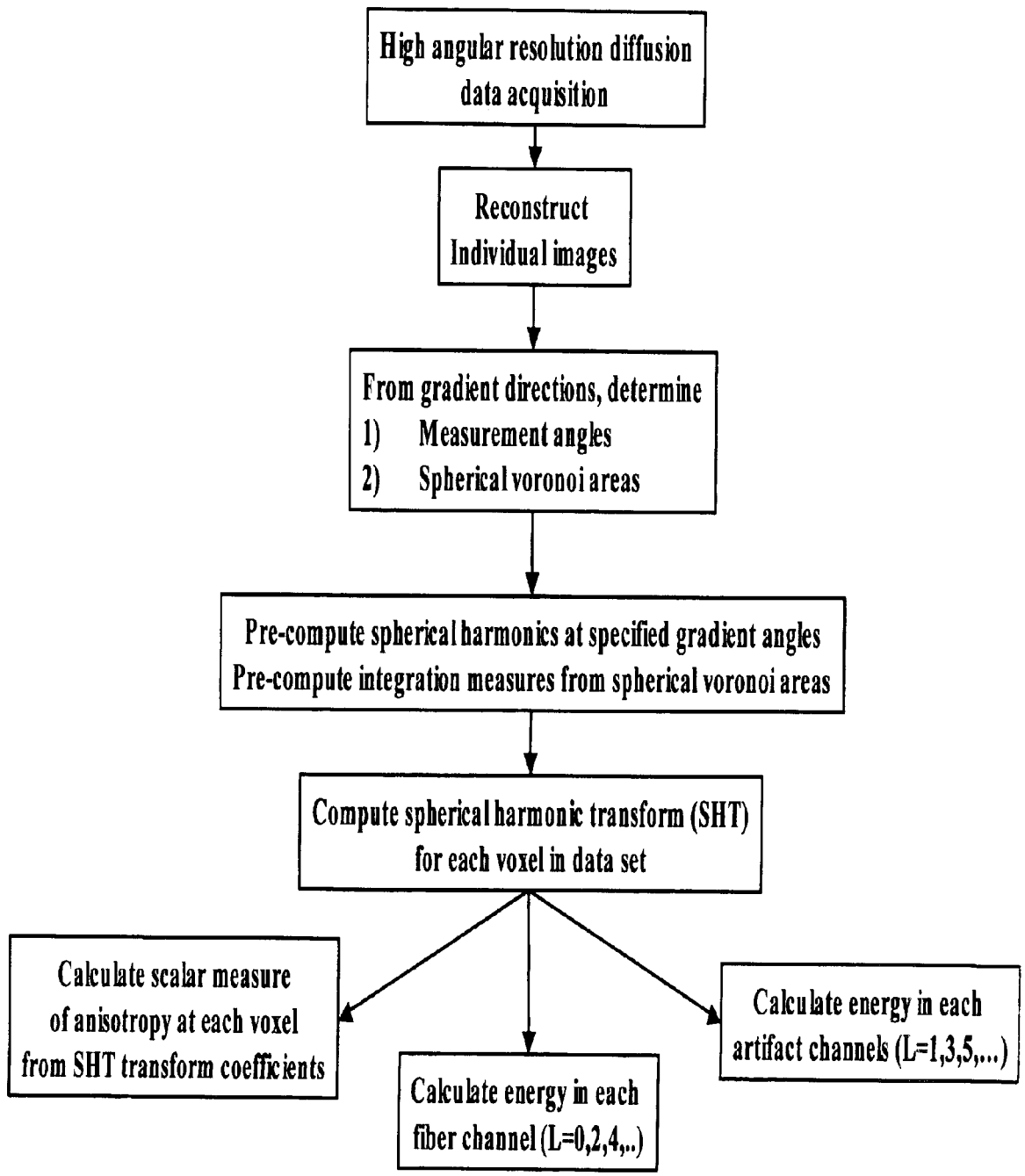

FIG. 17 further shows one implementation of the Spherical harmonic decomposition processing.

DESCRIPTION OF THE PREFERRED EMBODIMENT

MR Diffusion Measurements

Before presenting our strategy for characterizing diffusion anisotropy in multifiber systems, we summarize in this section the basic mathematical underpinnings of MR diffusion measurements. In what follows, a fiber will be defined as a particular diffusion tensor D. With this definition, a large bundle of parallel fibers would be synonymous with a single "fiber". While it is natural to confer cylindrical symmetry on a diffusion tensor as part of the definition of a fiber, we relax this restriction in order to more clearly establish where such symmetry actually effects the more general results.

Single Fiber

We first consider diffusion measurements made in a voxel containing a single fiber, following Hsu and Mori [17] throughout. The signal attenuation can be written $$S(b,D) = S_0 e^{-b\, d_{app}} \tag{1}$$

where b is related to the k-space trajectory k(t) by $b \equiv \int_0^{TE} k^2(t)\, dt$ and incorporates the gradient strengths. The gradient directions can be defined by the unit vector u. If the measurements are made along the principal axes, i.e., in the coordinate system in which the diffusion tensor is diagonal, the apparent diffusion coefficient $D_{app}$ is ([17])

$$D_{app} = u^T \cdot D_A \cdot u \tag{2}$$

and the applied diffusion encoding gradient u is in the direction of the eigenvectors of D.

$$u = \begin{pmatrix} u_1 \\ u_2 \\ u_3 \end{pmatrix}, \quad D_A = \begin{pmatrix} d_1 & 0 & 0 \\ 0 & d_2 & 0 \\ 0 & 0 & d_3 \end{pmatrix} \tag{3}$$

where the eigenvalues are the principal diffusivities {d$_1$, d$_2$, d$_3$}. Generally, however, this principal axis coordinate system is not known. The applied diffusion encoding gradients v are therefore not coincident with the principal axis system, but are related to it by a rotation R:

$$u = R\, v \tag{4}$$

where v is a unit vector in direction of diffusion encoding.

Figure 1:
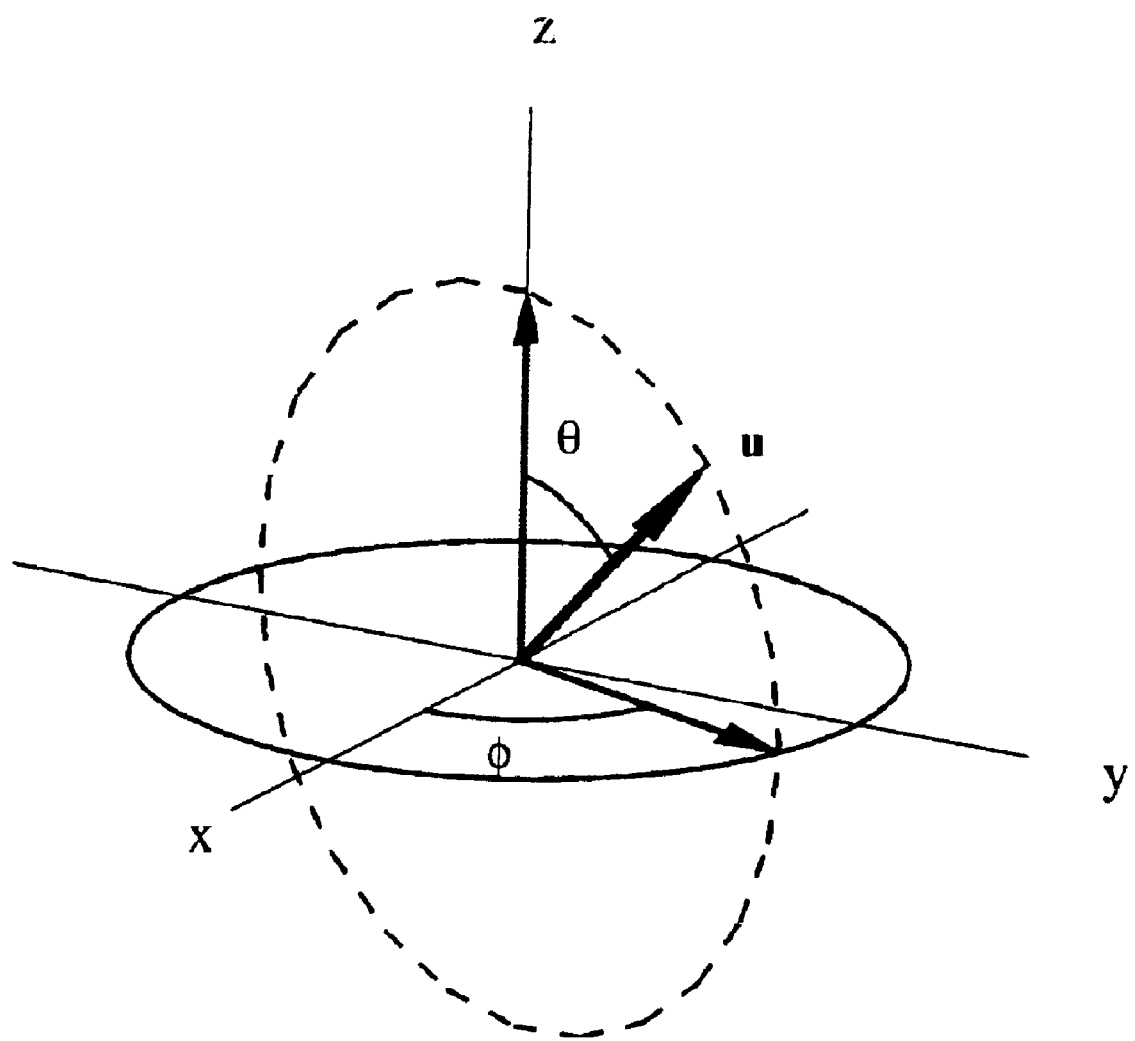
FIG. 1 diagrams a typical spherical coordinate system used in physics.

Thus, one usually wants to infer the principal diffusivities and the rotation R. From these can be determined the diffusion properties, such as the anisotropy, and the fiber directions. The rotation R is defined within the coordinate system shown in FIG. 1. The two angles that define the direction in this coordinate system are the polar angle θ∈ [0, π] which is defined as the angle between the vector and the positive z-axis, and the azimuthal angle φ ∈ [0,2π), which is defined as the angle in the x-y plane relative to the positive x axis. It is also common to use the elevation angle δ=90°−θ, which is the angle between the vector and the x-y plane. This is often denoted by φ, however, as in Hsu and Mori [417]. We will retain the standard physics usage, depicted in FIG. 1, where (θ, φ) denote the polar and azimuthal angles, respectively. We will often employ the shorthand notation Ω≡(θ, φ).

It is helpful to note that (θ, φ) are two of the Euler angles [18], used to describe rotations in 3-dimensional coordinates. These angles typically denoted (α,β,γ) where α is the azimuthal rotation angle, β is the polar rotation angle, and γ is a rotation about the new axis defined by the rotation through (α,β). For the description of a single point (i.e., a measurement) on a sphere, as is the case in this paper, rotations about the final (radial) axis are unimportant, so the rotations can be described by the two angles (α,β). It is common in this case to denote these (θ,φ).

The gradient direction vectors in the two coordinate systems are related by a rotation ([17]).

$$R = \begin{pmatrix} \sin\phi & -\cos\phi & 0 \\ \cos\phi\cos\theta & \sin\phi\cos\theta & -\sin\theta \\ \cos\phi\sin\theta & \sin\phi\sin\theta & \cos\theta \end{pmatrix} \tag{5}$$

The apparent diffusion coefficient for an arbitrary gradient direction υ can thus be written ([17])

$$D_{app} = \upsilon^T \cdot D \cdot \upsilon \tag{6}$$

where $$D \equiv R^T D_A R \tag{7}$$

Eqn 7 defines the diffusion tensor D in a rotated coordinate system. The signal from a single fiber is typically expressed in the form $$\log(S/S_0) = -b\hat{D} \tag{8}$$

where we introduce the shorthand notation $D \equiv D_{app} = \upsilon^T D\upsilon$. For any symmetric matrix D, such as the diffusion tensor, the product $x^T D x$ is a pure quadratic form [19]. From Eqn 8 one can estimate the diffusion tensor D by an eigenvalue decomposition whose eigenvectors effectively determine the rotation of the fiber coordinate system relative to the laboratory system and whose eigenvalues determine the diffusivities. Since D is positive definite, it can be written in the form of Eqn 7 where $D_A$ is diagonal and the unit eigenvectors of D are the columns of R. The rotation y=Rv produces the sum of squares $$v^T D v = v^T R D_A R^T v = y^T D_A y = \sum_i^n \lambda_i y_i^2 \tag{9}$$

From [19], the equation of $v^T D v = 1$ describes an ellipsoid whose axes end at the points where $\lambda_{i\, y\, i}^2 = 1$ and where the remaining y components are zero. Undoing the rotation, these points are in the directions of the eigenvectors and the axes have half-length $1/\sqrt{\lambda_i}$. It is important to emphasize, however, that the ellipsoid that describes the eigenspace of the diffusion tensor is not a description of the shape of the measured local diffusion [15].

Multiple Fibers

The definition of a fiber above can be extended to multiple fibers by defining the k'th fiber as synonymous with the k'th diffusion tensor $D_k$ with no assumption of cylindrical symmetry until it is necessary. In addition, the assumption will be made throughout that there is no exchange between fibers so that the signals add independently.

In general, the signal from a voxel containing n fibers can be written $$S = S_0 \sum_{k=1}^{n} f_k e^{-b\hat{D}_k} \tag{10}$$

Where $f_k$ is the volume fraction of the k'th fiber ($\nu_{k=1}^{n} f_k=1$). It will prove useful to express this in the following form (Taylor expanding about b=0):

$$\log(S/S_0) \approx -b \sum_{k=1}^{n} f_k \hat{D}_k - \frac{b^2}{2} \left\{ \sum_{k=2}^{n} f_k(1-f_k) \Delta \hat{D}_{kl}^2 - 2 \sum_{i=2,i\neq j}^{n} \sum_{j=2,j\neq i}^{n} f_i f_j \Delta \hat{D}_{il} \Delta \hat{D}_{jl} \right\} \tag{11}$$

where we have defined the differential apparent diffusion $\Delta \hat{D}_{kj} = \hat{D}_k - \hat{D}_j$. This form of writing the signal is useful in that it expresses the effect of additional fibers k≥2 relative to the first (k=1). For a single fiber, the terms in the bracket drop out and the log signal assumes the pure quadratic form utilized in Eqn 8 in the standard diffusion tensor approach. Each of the $\hat{D}$ is a quadratic, so each term in Eqn 11 is an even power polynomial in gradient direction υ. The approximation to orders $O(b^2)$ yields even polynomials up to order 4.

Special case: Two fibers

For multiple fibers within a voxel, Eqn 11 can be complicated. However, the special case of two fibers (n=2) is instructive and a useful approximation in practice. This is the simplest multifiber case, and the resulting equations have an intuitively clear interpretation and are numerically relatively simple to manage. From Eqn 11, the log signal case be written $$\log(S/S_0) \approx -b[f_1 \hat{D}_1 + f_2 \hat{D}_2] + f_1 f_2 \frac{b^2}{2} \Delta \hat{D}_{21}^2 \tag{12}$$

where $f_1$ and $f_2$ are the volume fractions in compartments 1 and 2, respectively so that $f_1+f_2=1$ and $\Delta \hat{D}_{21} = \hat{D}_2 - \hat{D}_1$, and we have kept terms up to second order in b. The measurements $\hat{D}_i$ are composed of second order polynomials, so the coupling term $\xi \equiv f_1 f_2 b^2 \Delta \hat{D}_{21}^2$ is composed of even order polynomials up to fourth order.

The two terms linear in b represent the individual fiber components and are pure quadratic forms. In addition, there is a coupling term, second order in b, with coefficient $f_1 f_2$ that is of fourth order. Note the interesting fact that the coefficient term $f_1 f_2$ is a quadratic function, with a maximum at $f_1=f_2$. The magnitude of the coupling thus depends on the volume fractions. However, the shape does not. This is clear from the fact that the volume fraction enters only as a multiplicative factor in $\xi$. Variations in the shape of the coupling term are more easily understood by rewriting in a more illuminating form. First note, from Eqn 6 and 7, that $$\Delta \hat{D}_{21} = \upsilon^T R_1^T \tilde{D}_{12} R_1 \upsilon \tag{13}$$

Where we have defined $$\tilde{D}_{12} \equiv R_{12}^T D_{2,A} R_{12} - D_{1,A} \tag{14}$$

$$R_{12} \equiv R_2 R_1^{-1} \tag{15}$$

The term $R_{12}$ is the product of rotation matrices and is therefore also a rotation matrix (by virtue of the group properties of the 3-Dimensional Rotation Group, denoted O (3) [20]). It first undoes the rotation $R_1$ then applies the rotation $R_2$. If the rotation $R_1$ and $R_2$ are the same, meaning that the fibers are pointing in the same direction, then $R_{12}=1$, and $\tilde{D}_{12}$ is a diagonal matrix with eignvalues equal to the difference in principal diffusivities between $D_1$ and $D_2$. If the fibers are identical in orientation and diffusivities (by our definition, $D_1=D_2$), then $\tilde{D}_{12}=0$, so that $\Delta \tilde{D}_{12}=0$ and the coupling term disappears, reducing the log signal to the standard single fiber form (Eqn 8). In general though, the term $\Delta \hat{D}_{21}$ is of the same form as the rotated single fiber diffusion matrices (e.g., Eqn 7) but in terms of the new tensor $\tilde{D}_{12}$, which we shall term the reduced diffusion tensor.

Figure 2:
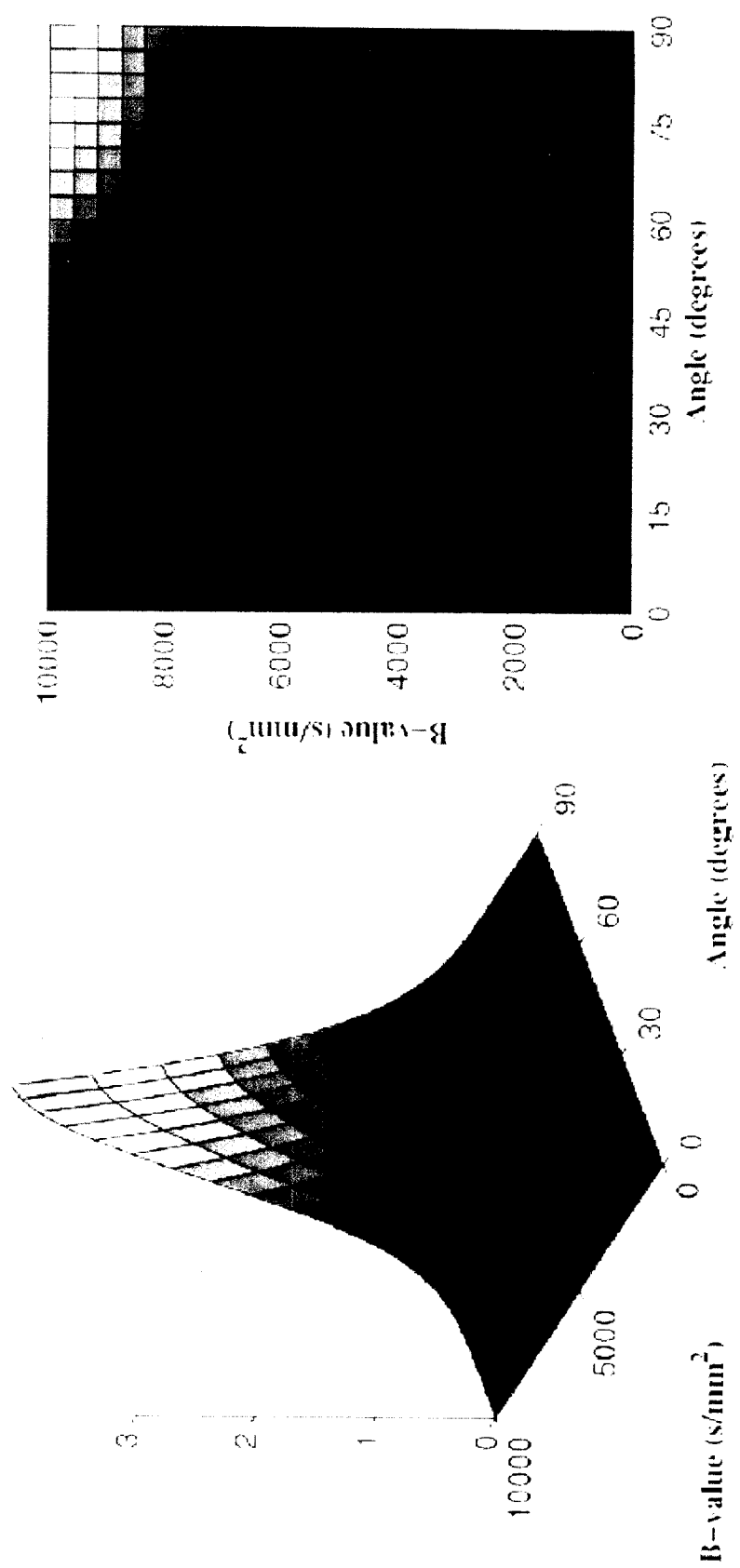
FIG. 2 shows the mean squared error between the true diffusion log (signal) (Eqn 13) and the approximate form (Eqn 14) as a function of b-values and azimuthal angle $\Delta\phi$ between two identical fibers oriented in the x-y plane (ie, polar angle $\theta=90°$). The approximation error gets worse for large b and large $\Delta\phi$ but is less than 0.05 for $b<5000_{s/mm2}$.
Figure 3A:
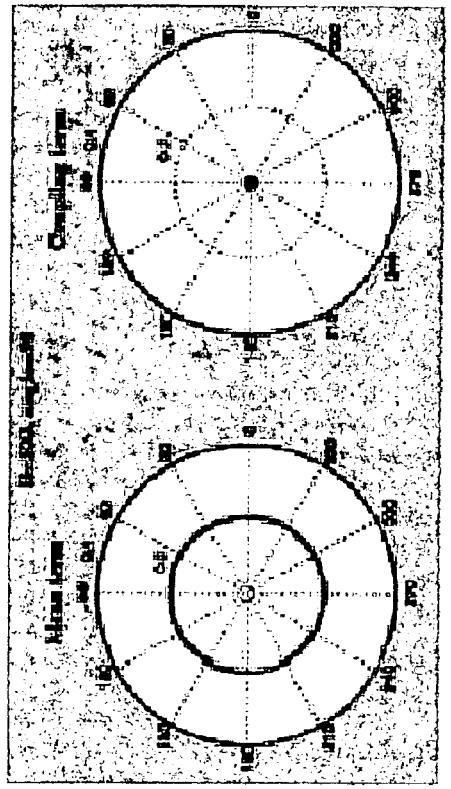
FIG. 3 depicts the effect of the coupling term in the approximation Eqn 14 in a voxel containing two fibers oriented in the x-y plane at an angle $\Delta\phi=90°$ relative to one another for three b-values: b=500, 2500, $5000_{6/mm2}$. (Left) The true $D_{app}$ and the approximate $D_{app}$ determined from Eqn 14. (Right) The mean and coupling terms in Eqn 14. For increasing b-values the approximation is less accurate, as demonstrated by the increasing discrepancy between the true and the estimated shapes in FIG. 2.
Figure 3A:
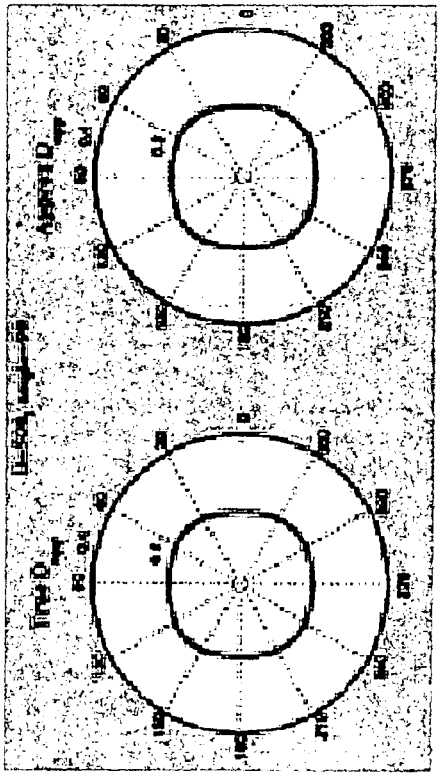
Figure 3B:
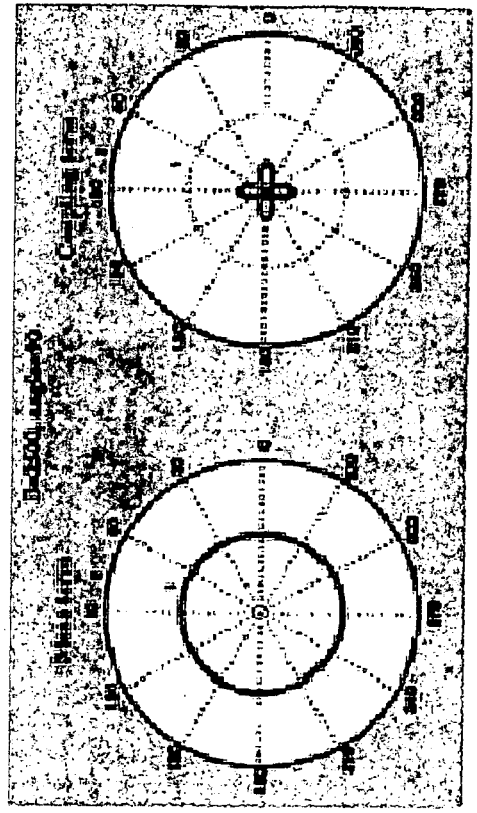
Figure 3B:
Figure 3C:
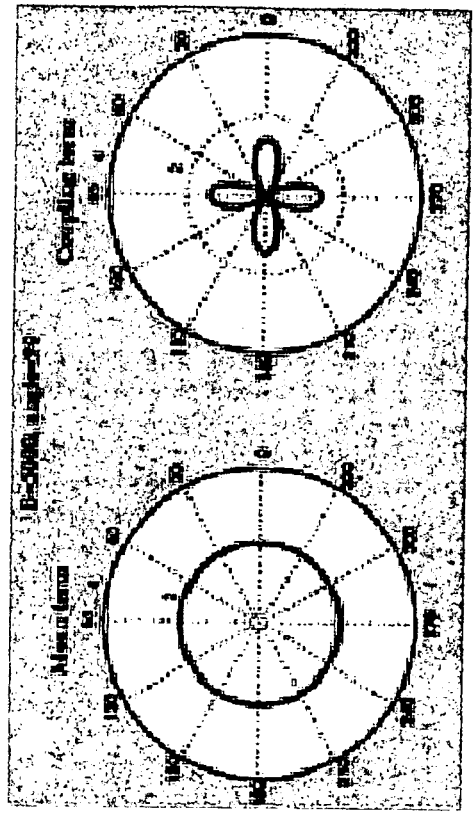
Figure 3C:
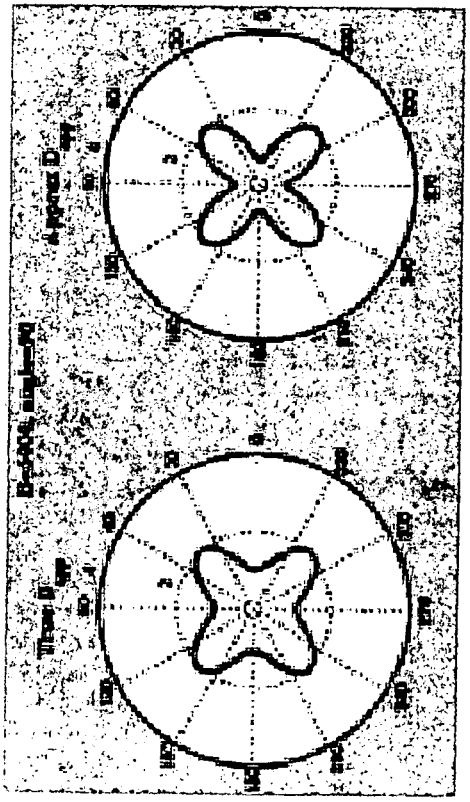

The accuracy of the approximation in Eqn 12 depends upon both the b-value and the relative orientation of the fibers. As shown in FIG. 2, this approximation is good up to quite high b-values. The manifestation of these errors is most clearly visualized by plotting $D_{app}$ as a function of b-value for $\Delta\theta=90°$ (the angle at which the influence of the coupling term is the greatest), an example of which is shown in FIG. 3. The results for HARD diffusion measurements can be summarized as follows:

1. The measured local diffusion is related to the diffusion in the fiber coordinate system by three-dimensional rotations.
2. The measured log signal from a single fiber is a pure quadratic form.
3. The measured log signal from a multiple fiber can be approximated by the sum of two pure quadratic forms and a coupling term of even polynomial up to order 4.

The question is this; If an eigenvector decomposition is sufficient to determine the diffusion tensor in the single fiber case, is there a decomposition sufficient to determine the diffusion in the case of multiple fibers? We show in the next section that this is indeed possible.

The Spherical Harmonic Decomposition
Spherical Tensor Representation of Rotations As described in Section 2, the diffusion measurements along different encoding directions can be expressed as rotations in 3-dimensions relative to the (unknown) principal axis system of the diffusion. In the HARD technique, these measurements are along a set of directions covering the range of the spherical coordinates (θ, φ). The rotations R were expressed using a form or representation in terms of the Euler angles. However, the problem was formulated in the familiar Cartesian coordinate system, or basis e={x y, z}, because this is the natural coordinate system for imaging. Systems with spherical symmetry are often more conveniently handled in the spherical basis: e={r, θ, φ} as defined in FIG. 1. As we show next, rotation matrices transformed into the spherical basis are the spherical harmonics [21]. Tensors transformed into this representation are called spherical tensors [21].

The HARD diffusion measurements have an inherent spherical symmetry because they are made by a series of three-dimensional rotations. The inherent symmetry in this problem can be elucidated through the theory of groups, which was originally developed for the purpose of characterizing symmetry [21]. The concept and consequences of groups, although extremely powerful, are conceptually relatively simple. Their great power is that they facilitate the characterization and classification of mathematical structures into classes or groups with similar symmetry properties. All members within a particular group can then be treated as equivalent, even if their specific manifestations differ. For example, two points constrained to move on the surface of the same sphere can be seen as having identical symmetry properties even if their precise locations on that sphere differ.

The importance of the spherical tensor formulation is encapsulated in the following expression, which shows how a spherical tensor T is affected by a general rotation $D_{m'm}^{1}$(R) in some representation R of the rotation group in the basis e:

$$T_{lm} = \sum_{m'=-l}^{l} \mathcal{D}_{m'm}^{l}(R) T_{lm'} \tag{16}$$

Notice that rotations of the individual m components within a particular component rank 1 do not "mix" elements amongst components of different rank 1. This quality of the Tis called irreducibility. Eqn 16 can be considered the defining quality of a spherical tensor a tensor that transforms accordingly is by definition a spherical tensor. The spherical tensor representation is useful because rotations of the individual tensor components preserve the rank.

Both the spherical tensor and the rotations can be related to our specific problem as follows. The diffusion tensor is a second rank tensor and so consists of nine components, represented by a 3×3 matrix. In its irreducible representation, the tensor is written as the sum of three terms:

$$T = T^O + T^a + T^S \tag{17}$$

where $T^O = T^0$ I in which $T^0$ is a rank 0 tensor (i.e., a scalar) and I is the 3×3 identity matrix, $T^a$ is an anti-symmetric rank 1 tensor *i.e., a vector) and $^{TS}$ is a symmetric, rank 2 tensor. The rotations $D^1_{m'm}$ ($\alpha,\beta,\gamma$) in the spherical tensor basis expressed in terms of the Euler angles are called the Wigner rotation matrices [21]. For a point in spherical coordinates, the Wigner rotation matrices are proportional to the spherical harmonics [22]:

$$\mathcal{D}_{m0}^{l*}(\alpha, \beta, \gamma) = \left(\frac{2l+1}{4\pi}\right)^{-1/2} Y_{lm}(\beta, \alpha) \tag{18}$$

Therefore, the process of rotating a diffusion tensor can be reformulated by expressing the diffusion tensor in an irreducible form in which its individual components transform separately under rotations affected by spherical harmonic components. In this general formulation, the concept of the diffusion tensor can easily be extended to more complex structures by considering tensors of higher rank because now the transformation under rotations are of exactly the same form (Eqn 16) and the functions that perform the rotations are exactly the same basis set (the spherical harmonics).

Application to HARD Measurements

Now, consider the general case of a HARD measurement of a voxel of unknown fiber composition. The measured apparent diffusion coefficient D ($\Omega$) is then an arbitrary real function. The complex spherical harmonics form a complete orthonormal basis [18] so an arbitrary real function parameterized by the spherical coordinates ($\theta,\phi$) can be expanded in a Laplace series:

$$D(\theta, \phi) = \sum_{l=0}^{\infty} \sum_{m=-l}^{l} a_{lm} Y_l^m(\theta, \phi) \tag{19}$$

The coefficients $\alpha_{lm}$ are determined by [18] multiplying both sides of Eqn 19 by $Y_1^{m'*}(\theta,\phi)$ and using the orthogonality condition $$\int_0^{2\pi} \int_0^{\pi} Y_l^m(\theta, \phi) Y_k^n(\theta, \phi) \sin(\theta) d\theta d\phi = \delta_{lk} \delta_{mn} \tag{20}$$

The expansion coefficients are uniquely determined by multiplying each side of Eqn 19 by $Y_k^{n*}(\theta, \phi)$ and integrating over the sphere. The result is that the coefficient can be determined by $$a_{lm} = \int_0^{2\pi} \int_0^{\pi} D_{app}(\theta, \phi) Y_k^n(\theta, \phi) \sin(\theta) d\theta d\phi \tag{21}$$

This is precisely analogous to a Fourier decomposition of sinusoidal functions, but on the unit sphere. This will be called the spherical harmonic transform or SHT of the measured apparent diffusion coefficient.

The utility of describing the measured HARD (log) signal in terms of group theoretical constructs can now be shown directly as follows. The measured HARD signal $\hat{D}(\Omega)$ is an arbitrary real function and so can be expanded in term of a Laplace series (Eqn 19) with the coefficients determined by the SHD (Eqn 21). But the symmetry of HARD diffusion measurements imposes severe restrictions on the expansion coefficients that allow direct classification of the diffusion from the SHD. In particular, the SHD of $\hat{D}(\Omega)$ produces the coefficients of the irreducible representation of $\hat{D}(\Omega)$.

Specifically, the following is true: Isotropic diffusion is independent of direction, so the lowest order $Y_{00}(\Omega)$ is the basis for the representation of $D_0$. This $\Omega$ is easily seen because $Y_{00}(\Omega)$ is just a sphere, so the calculated coefficient merely scales the radius of the sphere. This provides a 2 L+1=1 dimensional representation of the O (3). For a single fiber, the irreducible representation of $\hat{D}(\Omega)$ (Eqn 17) provides a basis for a six-dimensional representation of O (3) (with $T^O$ providing 2*0+1=1 and $T^S$ providing 2*2+1=5). The basis functions are then the spherical harmonics $Y_m$ ($\Omega$) of order L=0,2. Because this is an irreducible representation, Eqn 16 expresses the fact that fiber rotations do not alter the basis functions. That is, they only produce a redistribution of energy amongst the M components or variations in the phase of the M components, but not the order L. For multiple fibers, the log signal from multiple fibers can be expressed in terms of an expansion in even power polynomials (Eqn 11) and approximated up to relatively high b-values by keeping terms up to second order in b, which corresponds to terms of 4'th order polynomials. A multifiber voxel therefore provides a basis for a 2*(0+2+4)+3=15 dimensional representation of O(3) with basis functions being the spherical harmonics of even orders up to order L=4. The dimensions of the representation are the number of measurements that are required to characterize the D ($\Omega$). It is for this reason that 2*(0+2)+2=6 measurements are required to characterize the standard single fiber diffusion tensor.

The results can be summarized by the following rather remarkable conclusions:

1. Isotropic diffusion is described by $A_{00} Y_0^0(\Omega)$.
2. Single fiber diffusion is described by $$\sum_{l=0,2} a_{lm} Y_l^m(\Omega).$$

3. Multiple fiber diffusion is approximately described by $$\sum_{l=0,2,4}\sum_m a_{lm} Y_l^m(\Omega)$$

4. In general, the local diffusion, including the magnitude and orientation, can be described by sum of spherical harmonics of even order, i.e.

$$\sum_l \sum_m a_{lm} Y_l^m(\Omega),$$

5. Odd orders of the spherical harmonics describe asymmetric components and therefore imaging artifacts.
6. The coefficient alm is determined by the spherical harmonic transform of $\hat{D}(\Omega)$
7. The dimension of the representation is the number of measurements required to characterize the apparent diffusion coefficient $D(\Omega)$.

It is important to point out that the order L required to characterize the diffusion in a multifiber voxel depends upon the orientation of the two fibers. For fibers more closely aligned, higher orders of L will be required. This can be seen by considering the simplest case of two identical fibers lying in the θ=90° plane, oriented nearly parallel to one another. Distinguishing between the two fibers requires high resolution in the azimuthal angle φ. Since the azimuthal dependence of the spherical harmonics is proportional to exp(imφ), higher frequency variations in φ require larger values of m and thus higher orders L in the basis functions. We have focused on the simplest case in the present paper where L=4 is considered sufficient, but this is not required.

The group theory arguments provide a simple and concise description of the categorization of voxel diffusion characteristics, since the above results are expressible as direct sum subspaces. Let us call the "state" of a voxel with k fibers $\psi_k$, where k=0 means isotropic diffusion. Then we can write 1. Isotropic diffusion: $\psi_0 = D^{(0)}$.
2. Single fiber diffusion: $\psi = D^{(0)} \oplus D^{(2)}$.
3. Multiple fiber diffusion: $\psi \approx D^{(0)} \oplus D^{(2)} \oplus D^{(4)}$.

where the $D^{(j)}$ are the irreducible representations of the rotation group. In principle, the composition of a voxel in terms of these can be determined, as well as the magnitude and orientation of the local diffusion.

Figure 4:
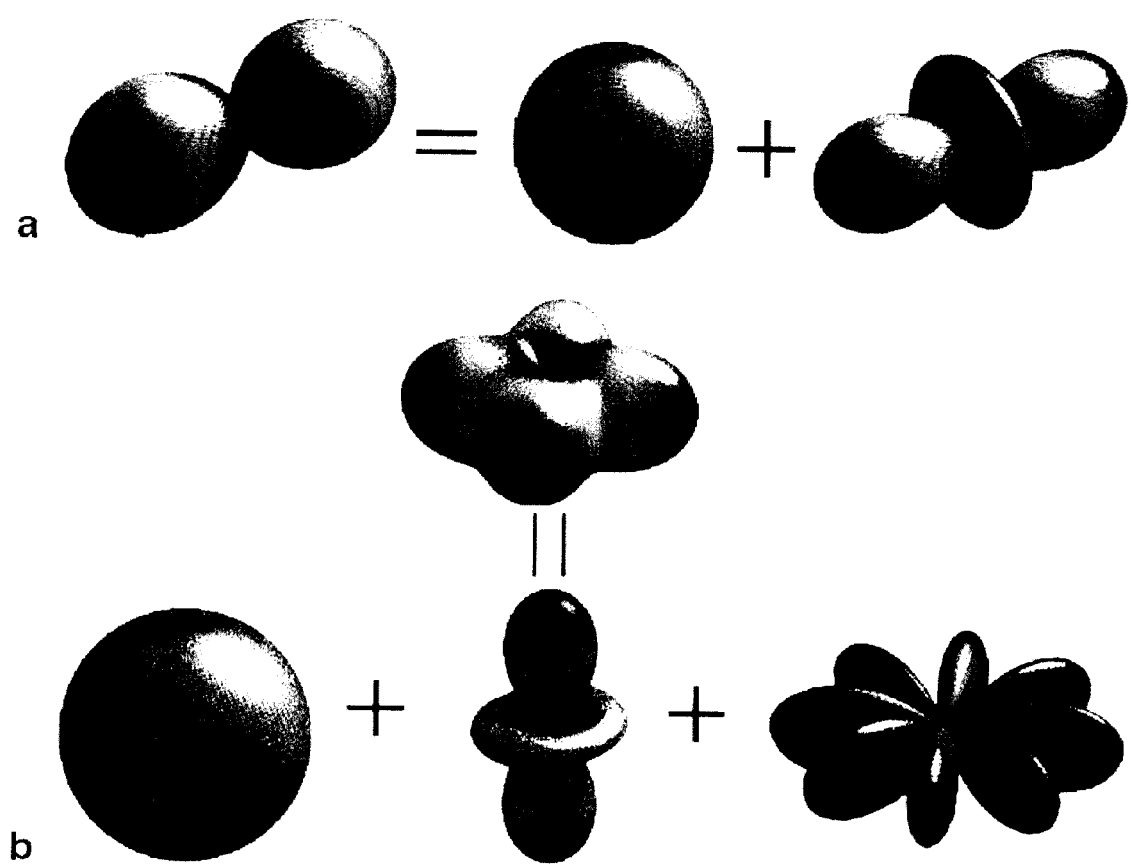
FIG. 4 is a graphical representation of the Spherical Harmonic Decomposition. The contributions to $D_{app}$ from the different L orders of the spherical harmonic decomposition are shown for a single fiber (a) and a double fiber (b) voxel.

This theory is easily confirmed by simulation, as shown in FIG. 4 where the $D_{app}$ for a single fiber and for two identical perpendicular fibers are broken down in terms of the separate contributions from the different spherical harmonic components. In these simulation we use a fiber model that possesses cylindrical symmetry, since this is a reasonable physical model for white matter geometry (e.g., [17]) though the above results do not require this. The corresponding SHD are shown in FIG. 6, which shows on the right the SHT of the $D_{app}$ from a single fiber (top) rotated through the entire range of both θ and φ, and two fibers (bottom) with one fixed along the x-axis and the relative angle between the fibers rotated through the entire range of both θ and φ. The $D_{app}$ for one particular orientation is shown on the left. No energy is produced in channels other than those predicted by the group arguments above.

The symmetry inherent in this problem precludes the power in the odd L channels. Energy in these channels in the SHD of actual experimental data is therefore produced by non-diffusion effects, such as slice offsets or eddy currents, which are not constrained to the same symmetry properties. This can be used to advantage as a means of identifying non-diffusion related variations. Of course, such variations may also have power in the diffusion related channels, so their reconstruction may not be trivial. The information in the odd channel might also be useful in incorporating eddy current correction into the image reconstruction.

The ability to characterize the diffusion does not imply that extraction of fiber information is easy, however. This becomes apparent in examining the coupling term ξ, about which can be said:

1. The shape of ξ depends on the eigenvalues of the reduced diffusion tensor, and thus on the relative anisotropies of two fibers.
2. The orientation (and hence phase) of ξ depends upon the mean orientation of fibers.
3. The magnitude of ξ depends on the volume fractions and the relative orientations of the fibers.

The last item underscores a basic ambiguity in the diffusion measurements: the volume fractions and relative orientations can confound information about one another in the measured signal. However, the orientation affects the phase, whereas volume fraction changes do not.

Computation and display of the SHD

Numerical methods. The spherical harmonic decomposition is achieved by computing the spherical harmonic transform of the measured (i.e., apparent) diffusion coefficient (Eqn 21). Unfortunately, unlike the Discrete Fourier Transform (DFT), for which there exists a matrix decomposition that allows the Fast Fourier Transform (FFT), no such algorithm exists for the SHT. Although a variety of algorithms have been proposed for the computation of spherical harmonic coefficients ([23, 24]), no clear algorithm has emerged as clearly superior, and the subject remains an area of active research. Therefore, for the present work the coefficients were determined by direct computation of Eqn 21.

The direct computation of Eqn 21 on a grid of N values of φ and M values of θ requires the computation of L×(2 L+1) spherical harmonics evaluated at N M points. The spherical harmonics involve multiple expensive trigonometric evaluations. Many of the trigonometric evaluations are redundant, however, so precomputation of these values can be used to speed up the computation. Direct computation of the measure sin (θ)dθdφ requires M trigonometric evaluations and $NM^2$ multiplies. However, an efficient algorithm for computing the measures was developed by noting that these weights in the summation that approximates the integral are equal to the Voronoi areas for the sampling points on the unit sphere. Precomputation of the trigonometric functions and the weights therefore allowed an efficient SHT. This algorithm has been incorporated into the authors diffusion plugin module in AFNI [25] and is sufficiently fast to rapidly process reasonably large HARD data sets[2]. For example, the data shown in the present paper are comprised of 10 slices and 43 directions. The SHT on the entire data set took only 1.25 minutes on an SGI Octane2 with dual RI 2000 processors.

Display of the SHD.

Before proceeding, it is important to outline our basic method of displaying the SHD data. Because there is a great deal of information produced by this method, we have found it is important to have a concise method for displaying the results. The SHD calculates components up to a user specified value of L, for all the 2 L+1 values of M associated with each L (because M=−L, . . . 0, . . . +L). A useful way to display the coefficients is thus on an array of coordinates (L, M), as shown in FIG. 5. Since M≤L, the diagram has a characteristic triangular shape (white boxes have no coefficients).

Generally, the coefficients are determined for a range of parameters, in which case the boxes become arrays wherein the parameters are varied. The first is where the parameters are the spatial coordinates (x, y). Then each "box" on the (L, M) plot is just an image of the spatial distribution of the amplitude of that specific (L, M) component of the SHD (e.g. FIG. 12 below). The other case of importance is when the parameters are the azimuthal and polar fiber angles ($\phi,\theta$) as shown in the example in FIG. 6. This is useful, for example, in showing that as a single fiber is rotated arbitrarily, there is a redistribution of amplitudes within the L=2 channel, but the energy remains completely contained with this channel, as predicted.

The Structure of the SHD of Diffusion Measurements
Determining significance of multiple fiber channel The categorization of voxel fiber composition outlined above suggests a strategy for the analysis of high angular resolution diffusion data. The spherical harmonic transform is taken for each voxel in the image and sorted into even and odd order L. The odd orders represent artifacts and therefore can be eliminated from the analysis. The remaining even orders up to order L=4 are then sorted in the following manner. Voxels with significant power in L=4 are classified as "multiple fibers", voxels with significant power in L=2 but not L=4 are classified as single fibers, and voxels with significant power in L=0 but not L=2 or L=4 are classified as "isotropic". Although the method to determine what is significant involves some subtlety, the basic strategy is clear. Having determined into which classification each voxel falls, the voxel local diffusion is determined from the sum of the appropriate spherical harmonics components (isotropic: L=0, single fiber: L=0,2, multiple fiber: L=0,2,4), with the coefficients determined from the spherical harmonic transform.

One method for the determination of significance is suggested by the results above that show that the magnitude of the L=4 term increases with increasing relative orientation of the fibers. Therefore a comparison of energy in the L=4 to the L=2 channel can be used to gauge of whether or not a voxel is of state $\psi_2$ or $\psi_4$. One measure of the significance of a multiple fiber channel is the fractional even order greater than 0 in that channel. We can define the Fractional Multifiber Index or FMI as $$FMI \equiv \frac{\sum_{L>4}\sum_M |A_{L,M}|^2}{\sum_M |A_{L=2,M}|^2}, L \text{ even} \qquad (22)$$

An example is shown in FIG. 10 (Bottom) for the simplest example of two fibers at a range of relative orientations ranging from parallel to perpendicular. This is a reasonable measure of comparison and means of separating single and multifiber channels, begging the question of which threshold to choose. We will use this here in lieu of a more complete probabilistic model that will be pursued in the future.

The Symmetry of Diffusion Weighting: Projective Subspaces

Decomposition of the diffusion into separate isotropic, single, and multifiber channels is a consequence of the group algebra, which generates additive subspaces that depends upon the degree of polynomial necessary to describe the measurements. However, this is far from the complete story, for it is just the L story. There is structure within the SHD contained in the way in which the energy is distributed amongst the M components.

There is a fundamental symmetry in the $D_{app}$ imposed by the imaging process because the signal loss due to diffusion along the direction of a gradient is insensitive to the sign of the motion. That is, equal diffusive motion in both the +x and −x directions produce the same diffusion related signal loss. This results in a projective symmetry, which can be visualized by the diagram in FIG. 7(top:a). In the mathematics literature, projective is synonymous with antipodal, and is unrelated with projection in the sense commonly used in the physics literature (i.e., the component along a chosen axis). Diffusion measurements are therefore represented by the projective subgroup of O(3) (denoted PSO(3)=O(3/Z(2) where "l" can be thought of as "mod" and Z (2) represents the group of two integers). This means that two antipodal points (the two integers) on a sphere are indistinguishable. The effect of projective symmetry is that it restricts the energy to even values of M because odd values are not symmetric in $\phi$. However, this symmetry imposed on the PSO(2) subgroup of O(3) is only evident for a single fiber in the equatorial plane ($\theta=90°$) because arbitrary rotations can be represented by mixtures of ($\phi,\theta$) components. These effects are demonstrated by simulation in FIG. 7(b–d).

The SHD for two fibers exhibits a similar symmetry. For two fibers in the equatorial plane oriented at $\Delta\phi=90°$ to one another, the mean component is cylindrically symmetric and therefore does not possess (L, M)=(2, ±2) components. For two fibers in the meridian plane oriented at $\Delta\theta=90°$ to one another, the coupling term generates all even M terms for L=0,2,4 except of (L, M)=(L, ±4). Two fibers in the equatorial plane generates only one set of non-zero M components: (L, M)=(4, ±4) components, similar to the single fiber, and by symmetry do not possess (L, M)=(2, ±2) components. Again, arbitrary rotations produce mixing into all available M components. The projective subspace behavior of two identical crossed fibers is shown in FIG. 7(e–g).

Fiber Orientation

Characterizing the local diffusion amounts to determining diffusion tensor(s) and their orientation(s) relative to the laboratory system. In the special case of cylindrically symmetric diffusion, a natural definition of the fiber orientation is the direction of the principal (i.e., largest) eigenvector $e_1$ of the diffusion tensor [8]. For the problem of multiple fiber voxels, the issue of orientation becomes more complicated, for one can ask not only the orientation of the individual fibers, but their orientation relative to one another. In this section we reconsider the case of the single fiber, but now in the context of the SHD. We then consider the simplest multifiber case of two cylindrically symmetric fibers at arbitrary orientations.

Single fiber orientation from the SHD.

Because the SHD results for a single fiber identically reproduce those of the diffusion tensor, a single fiber orientation can always be determined from the SHD by transforming from the spherical basis back to the Cartesian basis, thereby reconstructing the diffusion tensor, and then determining the fiber orientation from the principal eigenvector.

The key to determining the fiber orientation from the SHD is to recognize that a rotation $R\phi$ of the fiber by an azimuthal angle $\phi$ modulates that phase of the SHT components because the $\phi$ dependence of the coefficients is of the form $\exp(i\phi)$. On the other hand, fiber rotations $R_\theta$ by a polar angle produce amplitude variations because the $\theta$ dependence is proportional to $P_1 (\cos \theta)$, the Legendre polynomial, which is a polynomial in cos $\theta$ of order 1. As a consequence of Eqn 16, the $\theta$ variations mix energy amongst the available M components for a particular L component, but do not exchange energy amongst the L components.

These variations are illustrated in FIG. 8(a,b), where a single cylindrically symmetric anisotropic fiber is rotated through azimuthal angles $\phi=\{0°,45°,90°\}$ while fixed at the equatorial plane (i.e. $\theta=90°$) and through polar angles $\theta=\{0°, 45°, 90°\}$ while fixed at the prime meridian (i.e. $\phi=0°$). The phase and magnitude for the single fiber case shown in FIG. 8(a,b) and FIG. 8(c,d) demonstrate that the orientation can be determined from the phase, while the $\theta$ orientation can be determined from the amplitude.

In this example, the phase (FIG. 8(a,b)) is determined from the coefficient $a_{2,2}$ that corresponds to the spherical harmonic $Y_2^2=\sqrt{15/32\pi}\sin^2(\theta)e^{i2\phi}$ so that the estimate of the azimuthal orientation is $\hat{\phi}=\arg[a_{2,2}]/2$ where arg denotes the phase angle. The magnitude variation of $a_{2,0}$ as a function of $0\leq\theta\leq\pi$ is seen (FIG. 8(c,d)) to follow $P_1(\cos\theta)$ so that the estimate of the polar orientation $\hat{\theta}$ can be made by noting that the $a_{2,1}$ component has no energy for $\theta=90°$, so that the ratio of $a_{2,1}$ to $a_{2,0}$ can be related to the polar angle by: $\hat{\theta}=\tan^{-1}(a_{2,0}/a_{2,1})$.

Two-fiber orientation from the SHD

Determination of the fiber orientation in a multifiber voxel is complicated by the fact that the measured signal is not just a function of the individual fiber orientations, but of their relative orientations and their volume fractions. However, the coupling term $\xi$ that generates the L=4 components have some remarkable properties that make this problem tractable, at least for the two fiber case. Three limiting cases illustrate these properties.

The first is two fibers coplanar in the equatorial plane (i.e., $\theta=90°$). If the angle between the two fibers is kept constant but the two fibers are rotated relative to the laboratory coordinate system, then the coupling term $\tau$ rotates, causing a phase change in the L=4 components, but no magnitude change. This is shown in FIG. 9(a–b).

The second is two fibers coplanar in the meridian plane (i.e., $\phi=0°$). If the angle between the two fibers is kept constant but rotate the two fibers relative to the laboratory coordinate system, then the coupling term $\xi$ rotates, causing a phase change in the L=4 components, but no magnitude change. This is shown in FIG. 9(c–d).

The third is two fibers coplanar in the meridian plane (i.e., $\phi=0°$). If the angle between the two fibers is varied but the mean angle between the fibers is kept fixed, the size of the coupling term $\xi$ changes, disappearing when the fibers are aligned since this is identical to a single fiber. This is shown in FIG. 10(top:a–b).

The orientation results for the special case of two fibers can be summarized as follows:

Azimuthal rotations $R_\phi$ of two fibers together (i.e., fixed relative orientation but variable mean $\phi$ orientation relative to laboratory frame) produces only phase change in the components.

Polar rotations $R_\phi$ of two fibers together (i.e., fixed relative orientation but variable mean $\theta$ orientation relative to laboratory frame) produce a redistribution of magnitude change in components, but no phase changes.

Variable relative orientation but fixed mean orientation relative to the laboratory frame produces only magnitude changes in the coupling component, but the relative amplitudes of the components (i.e. the pattern) remains unchanged. Utilizing these results necessitates the assumption of a two-fiber model.

Methods

Images were acquired on a GE SIGNA 1.5T Clinical Imager with high-speed gradient hardware using a stimulated echo sequence with a stimulated echo spiral acquisition previously described [15]. Diffusion sensitive images were acquired on five normal human subjects, with approval from the Humans Subject Committee at UC San Diego.

High angular resolution diffusion encoding is achieved by generating gradient directions equally spaced on a sphere by tessellations of an icosahedron [13, 15], as shown in FIG. 11. This procedure produces directions that are equally separated in angle on the surface of a sphere. Single shot images were acquired at 9 slices with the following parameters: FOV=24 cm, slice thickness=3.8 mm, and matrix size 64×64 for approximately (3.75 mm×3.75 mm×3.8 mm) isotropic resolution, TR=2700 ms, TE=52 ms. The diffusion parameters were: diffusion gradient duration, $\delta=20$ ms, stimulated echo mixing time TM=200 ms, and b$\cong$3000 s/mm$^2$, and 43 diffusion directions determined by the icosahedral tessellations of a sphere. Twenty averages at each diffusion direction were collected to ensure high signal-to-noise ratios, and resulted in a total scan time of $\cong$34 min.

Results

The spherical harmonic decomposition (up to order L=5) of a HARD data set collected in a normal human volunteer is shown FIG. 12. Note that the energy is indeed confined to the L=0,2,4, except for the artifacts appearing at (L, M)=(0, 1). This is discussed below. The isotropic, single fiber, and multiple fiber channels reconstructed from this transform are shown in FIG. 12 (bottom). Measured $D_{app}(\theta,\phi)$ from the multifiber channel of FIG. 12 are compared with simulations in FIG. 16 assuming 2 fibers oriented $\Delta\phi$ relative to one another. As predicted, the isotropic channel appears to consist of gray matter, the single fiber channel looks like a white matter map, and the multifiber channel corresponds anatomically to regions of complex fiber geometry. From the coefficients of the SHT shown in FIG. 12, the local $D_{app}$ can be calculated. In FIG. 13 are shown representative shapes from the three different channels.

For the representative voxel from the multiple fiber voxel the extreme case of nearly identical fibers crossed at 90° was chosen since the failure of the DTI method is most apparent in this circumstance. However, it is important to note that regions of significant energy in the multifiber channel do not necessarily correspond to "black holes" in the standard DTI maps (such as those shown in [15]) since this effect is produced only in the specific case of identical fibers oriented at 90° to one another. However, these regions do correspond to regions in which characterization by a single diffusion tensor is incorrect, and will produce spurious results in the estimation of diffusivities and orientations.

FIG. 12 (bottom) shows significant energy in the (L, M)=(0, 1) channel. Since this is an odd channel, it cannot be related to diffusion. The structure of this channel can be understood from the reconstruction of the shape produced by the (L, M)=(0, 1). The addition of $Y_1^0$ to $Y_0^0$ causes the isotropic sphere to be offset in the z-direction. This is consistent with both eddy currents and slight imperfections in slice refocusing. The likeness of the $Y_0^1$ channel to a gray matter map is a consequence of the fact that the artifacts that generate these components are most evident in regions of large isotropic diffusion where the diffusion "sphere" is prominent.

A white matter map is reconstructed from the energy in the L=2, 4 channels, regardless of any categorization as single or multiple fiber, and shown in FIG. 15, along with a map of the energy in the odd channels which shows little structure. The magnitude of the single fiber channel, and the estimated maps of $\theta$ and $\phi$, is shown in FIG. 14 for a different slice from the same data set.

Discussion and Conclusion

The recognition of the MR sensitivity to diffusion anisotropy [4] occurred shortly after the initial studies of isotropic diffusion [2, 3], but really blossomed with the recognition of its utility for the study of fibrous biological systems [10, 11]. The natural first step in quantifying anisotropic diffusion is to assume a Gaussian model for a single fiber, from which a diffusion tensor model ensues [8]. From this model can be estimated the fiber diffusivities and orientation, and the conditions sufficient to capture this information [9]. While it was recognized that this method is restricted to single fiber [8, 12], development of a technique to measure more complex systems was only recently proposed [13]. With the general goal being to investigate complex anatomical structures with no a priori assumptions about the diffusion characteristics, the sampling criterion is no longer based upon a presumed model, and so is phrased in terms of being "unbiased" in the sense that no direction is assumed preferable. The result is sampling on a sphere with a radius defined by the b-value with sufficient density to detect diffusion changes in different directions [13]. The question then arises: How does one characterize the diffusion from such measurements? One approach, suggested by Wedeen [14], is to extend the measurements to several radii by collecting "shells" of high angular spherical resolution data and Fourier transforming the data to produce a "q-space" image [26]. This method is sensitive to restricted diffusion because it samples a range of b-values, but is unnecessarily complicated for the determination of non-Gaussian diffusion arising, for instance, from multiple fiber directions. As pointed out inn [15], the magnitude of b, in conjunction with high angular resolution sampling, is sufficient for this purpose. The more pertinent question is how to characterize HARD measurements made at high b-values, which is the subject of the present paper.

Our approach to characterizing the diffusion measured with the HARD technique is based on characterizing the shape of the measured apparent diffusion coefficient Using the methods of group theory, this characterization is that HARD measurements can be decomposed into irreducible representations of the rotation group in which isotropic, single fiber, and multiple fiber components are three, separable direct sum subspaces. In our initial investigation of this problem, deviations from a spherical surface in the form of the variance of the measurements were used as a measure of anisotropy, the spherical diffusion variance [15]. While this had the advantage over the diffusion tensor method in identifying regions of anisotropy not well characterized by a single diffusion tensor, it is unable to quantify this anisotropy in any meaningful way. In particular, it does not allow the quantitation of either the magnitude or direction of diffusion. The present work can be seen as a formalization of this approach, since the spherical harmonics higher than $Y_0^0$, which contribute to the spherical diffusion variance, characterize how the various anisotropic components contribute to the variance.

A strength of the approach is that it does not require any a priori information about the diffusion. The utility of the decomposition results from the group algebra imposed by the symmetries of both the measurement scheme and the diffusion. The decomposition allows distinction of diffusive and non-diffusive signal variations, as well as distinction amongst diffusion variations. In particular, the diffusion channels can be broken down into direct sum subspaces representing isotropic, single fiber, and multiple fiber components. Asymmetries produced by experimental artifacts fall into channels impossible to reach by diffusion, thereby providing a direct means of noise reduction within the diffusion channels as well as a means for identifying artifactual effects.

The numerical computation of the spherical harmonic transform (SHT) was implemented in the most naive fashion, by direct computation of the coefficients by a discretized version of the integral Eqn 21, in a fashion analogous to a discrete Fourier transform (DFT) on a sphere. This method is time consuming. Unfortunately, there is no matrix decomposition of the SHT analogous to that used to implement the fast Fourier transform (FFT) from the DFT that would facilitate a fast SHT. Several methods for fast SHT computation have been proposed (e.g., [27, 28, 29, 30, 23, 24]) and will be investigated for application to the current problem.

A very general problem that arises is the determination of the voxel composition from the SHD. The solution to this problem hinges on the ability to estimate the parameters of a voxel, in particular, the number of fibers, their volume fractions, anisotropies, and orientations. Even in the simple example discussed above of two fibers, it was shown that it is not possible to determine all of these uniquely, as the volume fraction and relative fiber orientation both affect the higher order SHD components in a similar fashion. In practice, fiber configurations within a voxel may be much more complicated than the simple two fiber model making the problem of parameter determination exceedingly complicated.

The power of the SHD, however, is the fact that the identification of the existence of multiple fibers is not dependent upon making this distinction: multiple fibers of any sort show energy in the higher channels. Moreover, even in lieu of a particular fiber model, the SHD allows the shape of the diffusion measurements to be quantified by the coefficients of the SHT. These may be then used to reconstruct the diffusion structure in each voxel depending upon the user model. With constraints, such as on the number of fibers, the computational complexity can be reduced. An example is shown in FIG. 16 in which two fibers were assumed. One solution for the composition in both angles and volume fractions was estimated simply by trial and error in the simulation. However, one can imagine formalizing this process by choosing a limited maximum number of fibers and searching over number of fibers, the relative angular displacements between the fibers and the fiber volume fractions in order to estimate these quantities. Incorporation of other imaging information may augment this estimation.

For the purpose of determining the significance of the power in the multiple fiber channels in order to determine whether a voxel actually contains multiple fiber directions, some comparison with the single fiber channel is required. For this purpose, a simple statistic for determining the significance of the multifiber channel, the Fractional Multifiber Index, was introduced. While this a natural measure, there is no indication of its optimality. A more formal probabilistic analysis needs to be undertaken to determine a method for determining the significance of energy amongst the channels.

We remind here that what we have loosely referred to as "fibers" are really fiber bundles, within which the water movement that produces the diffusion signal is most likely complex. We have implicitly assumed that all the fibers that make up a bundle are essentially identical. Moreover, we have also made the assumption throughout this paper that there is no exchange between fibers, so that the signals from the individual fibers add independently. This will not be true in general. Both of these assumptions are made here, as they are in most of the DTI literature, not for lack of recognition, but because the true nature of the diffusion signal can be exceedingly complicated and is beyond the scope of the current paper.

The characterization of fibers in terms of even orders of L is a consequence of the symmetry. Experimental artifacts, such as eddy current effects, that do not possess such symmetry, are not confined to the even channels and therefore appear in the odd L channels. Energy in these channels therefore indicates the presence of non-diffusion effects. The SHD, by automatically separating out some fraction of the non-diffusion energy, effectively reduces the noise in the diffusion channels. This has great potential for use on systems for which artifacts are present.

In practice, the issue of multiple fiber directions within a voxel is intimately tied to the image resolution: For higher resolution there will be fewer voxels with multiple directions. Nevertheless, there will always remain heterodirectional voxels at any resolution. Moreover, the penalty in SNR per unit time can make high-resolution diffusion imaging over a large region prohibitive. A post-processing scheme capable of accurately identifying and quantifying multiple fiber voxels may lead to more efficient acquisition protocols.

One important application of our method is its incorporation of multifiber voxels into fiber tract mapping schemes. This will require utilizing estimates of the individual fiber orientations and volume fractions determined from the SHD of individual voxels. Additional machinery to keep track of multiple possible pathways of fibers passing through such voxels will then be necessary.

It is worth reiterating that the described method reduces to the standard diffusion tensor method in the presence of single fiber voxels, so no penalty of information is imposed by its usage. Rather, deviations from the DTI model due to artifacts or multiple fiber directions are readily extracted and quantified, allowing a more complete description of complex diffusion processes in tissues. More specifically, in one implementation of the above spherical harmonic decomposition (SHD), a method for analyzing magnetic resonance imaging (MRI) data may include representing MRI diffusion data of a body part as a summation of spherical harmonic functions and separating terms of the spherical harmonic functions to represent different diffusion effects including information on anisotropy in diffusion embedded in the MRI data. This separation of the spherical harmonic functions suppresses noise in extracted diffusion data contributed from non-diffusion effects.

FIG. 17 further shows one implementation of the above SHD processing. MRI images are constructed from high angular resolution diffusion data. The gradient directions are used to determine measurement angles and spherical Voronoi areas in the MRI images. Next, the spherical harmonic functions at specified gradient angles are computed and integration measures are also computed from the spherical Voronoi areas. Subsequently, a spherical harmonic transform for each voxel is performed to obtain coefficients for the spherical harmonic functions; The coefficients of the spherical harmonic transform are used to extract information on diffusion anisotropy.

Notably, the SHD provides a general method for characterizing diffusion in MRI. In implementation, it is desirable to have a simple quantitative measure of anisotropy that can be used to easily compare experimental results, such as to summarize the diffusion anisotropy (DA) in regions of interest, and amongst subjects. In DTI, the most common such measures at the relative anisotropy index (RA) and the fractional anisotropy index (FA) which are simple scalar measures of anisotropy calculated from the estimated diffusion tensor. See, e.g., Basser, P. J., Pierpaoli, C., Microstructural and physiological features of tissues elucidated by quantiative diffusion tensor MRI, Journal of magnetic Resonance B, vol. 111, pages 209–219(1996). These measures can be generalized to the more general tensor expansion of the SHD as follows. The RA is defined as the ratio RA= $\sqrt{D_A \cdot D_A}/\sqrt{D_1 \cdot D_1}$, where $D_A$ is the anisotropic component of D and $D_1$ is the isotropic component. The FA is defined as the ratio FA=$\sqrt{D_A \cdot D_A}/\sqrt{D \cdot D}$. Using the definitions of RA and FA, but with the more general SHD expansion of D, we can write a more general forms the general RA or GRA and the generalized FA or GFA:

$$GRA = \frac{1}{a_{00}} \sqrt{\sum_{l=2,4,\ldots}^{l_{max}} \sum_{m=-l}^{l} a_{lm}^2},$$

$$GFA = \sqrt{\sum_{l=2,4,\ldots}^{l_{max}} \sum_{m=-l}^{l} a_{lm}^2} \Big/ \sqrt{\sum_{l=0,2,4,\ldots}^{l_{max}} \sum_{m=-l}^{l} a_{lm}^2},$$

where the $a_{lm}$ are the coefficients in the SHD. These scalar measures easily make the additional information obtained form the SHD apparent in the increased visibility of white matter (WM) structures in areas of complex fiber orientation, such as where the corpus callosum crosses hemispheres. Both the GRA and the GFA provides a simple and useful metric to quantitate DA from the results of the SHD. Since the FA is the most prevalent index used in the DTI literature, we will use it as the metric for by which DA will be measured in the DTI, and will use its generalization to the GFA as the index for the SHD. The HARD data are a superset of the data required for DTI, so that the same data set can be analyzed using both DTI and HARD methods.

While the foregoing specification has been described with regard to certain preferred embodiments, and many details have been set forth for the purpose of illustration, it will be apparent to those skilled in the art that the invention may be subject to various modifications and additional embodiments, and that certain of the details described herein can be varied considerably without departing from the spirit and scope of the invention. Such modifications, equivalent variations and additional embodiments are also intended to fall within the scope of the appended claims.

References

[1] D. LeBihan and P. J. Basser. Molecular diffusion and nuclear magnetic resonance. In D. LeBi han, editor, Diffusion and Perfusion Magnetic Resonance Imaging, New York, 1995. Raven Press.

[2] H. Y. Carr and E. M. Purcell. Effects of diffusion on free precession in nuclear magnetic reso nance experiments. Phys. Rev., 94 (3): 630–638,1954.

[3] E. L. Hahn. Detection of sea-water motion by nuclear precession. J. GeoPhys. Res., 65: 776, 1960.

[4] E. O. Stejskal. Use of spin echoes in a pulsed magnetic field gradient to study anisotropic, restricted diffusion and flow. J. Chem. Phys., 43 (10): 3597–3603,1965.

[5] M. E. Moseley, Y. Cohen, J. Mintorovitch, L. Chileuitt, J. Tsuruda, D. Norman, and P. Wein stein. Evidence of anisotropic self-diffusion in cat brain. In Proceedings of the Eighth Annual Meeting, page 136, Amsterdam, 1989. Society of Magnetic Resonance in Medicine.

[6] M. E. Moseley, J. Kucharczyk, H. S. Asgari, and D. Norman. Anisotropy in diffusion weighted MRI. Magn Reson Med, 19: 321–326,1991.

[7] P. J. Basser and C. Pierpaoli. Microstructual and physiological features of tissues elucidated by quantitative diffusion tensor MRI. J. Magn. Reson. B., 111: 209–219, 1996.

[8] P. J. Basser, J. Mattiello, and D. LeBihan. Estimation of the effective self-diffusion tensor from the NMR spin echo. J. Magn. Reson., 103: 247–254, 1994.

[9] P. J. Basser and C. Pierpaoli. A simplified method to measure the diffusion tensor from seven MR images. Magn. Reson. Med., 39: 928–934,1998.

[10] T. L. Chenevert, J. A. Brunberg, and J. G. Pipe. Anisotropic diffusion in human white matter: demonstration with MR techniques in vivo. Radiology, 177: 401–405,1990.

[11] M. Doran, J. V. Hajnal, N. Van Bruggen, M. D. King, I. R. Young, and G. Bydder. Normal and abnormal human white matter tracts shown by MR imaging using directional diffusion weighted sequences. J. Comput. Assist. Tomogr, 14: 865–873,1990.

[12] C. Pierpaoli, P. Jezzard, P. J. Basser, A. Barnett, and DiChiro G. Diffusion tensor MR imaging of the human brain. Radiology, 201: 637–648, 1996.

[13] D. S. Tuch, R. M. Weisskoff, J. W. Belliveau, and V. J. Wedeen. High angular resolution diffusion imaging of the human brain. In Proceedings of the Seventh Annual Meeting, page 321, Philadelphia, 1999. International Society of Magnetic Resonance in Medicine.

[14] V. J. Wedeen, T. G. Reese, D. S. Tuch, M. R. Weigel, J.-G. Dou, R. M. Weiskoff, and D. Chesler. Mapping fiber orientation spectra in cerebral white matter with fourier transform diffusion MRI. In Proceedings of the Eighth Annual Meeting, page 82, Denver, Colo., April 2000. Inter national Society of Magnetic Resonance in Medicine.

[15] L. R. Frank. Anisotropy in high angular resolution diffusion weighted MRI. Magn Reson Med (accepted), 2001.

[16] L. R. Frank. Characterization of anisotropy in high angular resolution diffusion weight MRI. In Proceedings of the 9th Annual Meeting, page 1531, Glasgow, Scotland, 2001. International Society of Magnetic Resonance Medicine.

[17] E. W. Hsu and S. Mori. Analytical expressions for the NMR apparent diffusion coefficients in an anisotropic system and a simplified method for determining fiber orientation. Magn Reson Med, 34 (2): 194–200, August 1995.

[18] G. Arfken. Mathematical Methods for Physicists. Academic Press, 2nd edition, 1970.

[19] G. Strang. Linear Algebra and its Applications. Academic Press, New York, 1 edition, 1976.

[20] J. P. Elliott and P. G. Dawber. Symmetry in Physics. Vol 1: Principles and Simple Applications. MacMillan, 1979.

[21] E. P. Wigner. Group Theory and its Application to the Quantum Mechanics of Atomic Spectra. Academic Press, 1959. Translation by J. J. Griffin of the 1931 German edition.

[22] L. C. Biedenharn and J. D. Louck. Angular Momentum in Quantum Physics: Theory and Applications, volume 8 of Encyclopedia of Mathematics and its Applications. Addison-Wesley, Reading, Mass., 1981.

[23] D. W. Ritchie and G. J. L. Kemp. Fast computation, rotation, and comparison of low resolution spherical harmonic molecular surfaces. Journal of Mathematical Chemistry, 20 (4): 383–395, March 1999.

[24] M. J. Mohlenkamp. A fast transform for spherical harmonics. Journal of Fourier Analysis and Applications, 5 (2/3): 159–184,1999.

[25] R. W. Cox, A. Jesmanowicz, and J. S. Hyde. A program for the analysis for functional magnetic resonance imaging data. Computer Vision and Graphics, 1996. Available at http ://afni. nimh. nih. gov.

[26] P. T. Callaghan. Principles of Nuclear Magnetic Resonance Microscopy. Oxford University Press, 1991.

[27] G. A. Dilts. Computation of spherical harmonic expansion coefficients via FFT's. J. Comput. Phys., 57: 439–453,1985.

[28] P. N. Swarztrauber. The vector harmonic transform method for solving partial differential equations in spherical geometry. Mon. Wea. Rev., 121: 3415–3437,1993.

[29] J. R. Driscoll and D. M. Healy. Computing fourier transforms and convolutions on the 2-sphere. Adv. in Appl. Math., 15: 202–250,1994.

[30] J. C. Adams and P. N. Swarztrauber. SPHEREPACK 2.0: A model development facility. Tech nical Report TN-436-STR, NCAR, September 1997.

What is claimed is:

1. A method for characterizing specimen structure from diffusion anisotropy in magnetic resonance imaging without invoking the diffusion tensor formalism, comprising : collecting a plurality of high-angle resolution diffusion image data employing a diffusion-weighted stimulated echo spiral acquisition process; computing spherical diffusion variance in each voxel by a spherical harmonic transform of the diffusion data; identifying components in a plurality of compartments in the voxel, comprising at least three separate diffusion channels, wherein the diffusion channels are apportioned into direct sum subspaces representing isotropic, single fiber, and multiple fiber components, and wherein asymmetries produced by experimental artifacts fall into other undelineated channels impossible to reach by diffusion, thereby, providing direct means of noise reduction within said diffusion channels, and means for identifying artifactual effects; and determining magnitude and direction of diffusion by computing from the spherical harmonic transform magnitude and phase.

2. A method for characterizing multi-component magnetic resonance images of multidirectional crossed fibers in a specimen, comprising: obtaining a plurality of high angular diffusion-weighted image signals, each image obtain ed by applying a diffusion gradient pulse; employing a simple spherical harmonic transform algorithm to identify diffusion anisotropy based upon the variance of the estimated apparent diffusion coefficients as a function of measurement direction; and constructing computerized images of components within a voxel to determine magnitude and alignment of fibers.

3. A method as described in claim 2, wherein the diffusion gradient pulsing is in an icosahedron pattern.

4. A method as described in claim 3, wherein the icosahedron pattern is obtained by a plurality of high angle tessellations upon a spherical representation of a specimen.

5. A method as described in claim 2, wherein the specimen is white matter in the mammalian body.

6. A method for analyzing diffusion data collected with magnetic resonance imaging of a specimen, comprising: applying a mathematical group theory to analyze spherical diffusion variance in diffusion-weighted image data collected, wherein said data are applied to a spherical harmonic transform; reducing data collected to a numerical algorithm, wherein the algorithm is easily implemented to characterize anisotropy in multifiber systems; identifying components in a voxel as isotropic, single fiber, or multiple fiber structures forming a plurality of at least three separate channels ; and determining magnitude and direction of diffusion by computation from the transform magnitude and phase.

7. A spherical harmonic transform algorithm useful in characterizing diffusion anisotropy from signals collected by employing high-angle resolution magnetic resonance imaging, said transform derived from mathematical group theory based on symmetrical conformity.

8. A spherical harmonic transform algorithm as described in claim 7, wherein said algorithm is useful in the characterizing by determining the composition of a voxel in terms isotropic, single fiber, and multiple fiber channels.

9. A spherical harmonic transform algorithm as described in claim 8, wherein said algorithm is further useful in determining magnitude and orientation of a diffusion field.

10. A spherical harmonic transform algorithm as described in claim 8, wherein said algorithm is useful in determining the composition and orientation of fibers in white matter.

11. A computer program of a spherical harmonic transform algorithm useful in characterizing diffusion anisotropy from signals collected by employing high-angle resolution magnetic resonance imaging, said transform derived from mathematical group theory based on symmetrical conformity.

12. A method for analyzing magnetic resonance imaging (MRI) data, comprising:
representing MRI diffusion data of a body part as a summation of spherical harmonic functions; and
separating terms of the spherical harmonic functions to represent different diffusion effects including information on anisotropy in diffusion embedded in the MRI data while suppressing noise in extracted diffusion data contributed from non-diffusion effects.

13. The method as in claim 12, further comprising using coefficients of even-rank spherical harmonic functions to extract information on anisotropic diffusion effects within a voxel.

14. The method as in claim 13, wherein a single-fiber diffusion effect is described by $$\sum_{l=0,2} a_{lm} Y_l^m(\Omega)$$

where 1 is the rank of the spherical harmonic function $Y^m_1(\Omega)$ and each of $a_{1m}$ is a coefficient determined by a spherical harmonic transformation of a diffusion tensor associated with the MRI data.

15. The method as in claim 13, wherein a multiple-fiber diffusion effect is described by $$\sum_{l=0,2,4} \sum_{m=-l}^{+l} a_{lm} Y_l^m(\Omega)$$

where 1 is the rank of the spherical harmonic function $Y^m_1(\Omega)$ and each of $a_{1m}$ is a coefficient determined by a spherical harmonic transformation of a diffusion tensor associated with the MRI data.

16. The method as in claim 13, wherein a sum of spherical harmonic functions of even orders $$\sum_{l=0,2,4,\ldots} \sum_{m=-l}^{+l} a_{lm} Y_l^m(\Omega)$$

is used to describe local diffusion effects in the MRI data, where 1 is the rank of the spherical harmonic function $Y^m_1(\Omega)$ and each of $a_{1m}$ is a coefficient determined by a spherical harmonic transformation of a diffusion tensor associated with the MRI data.

17. The method as in claim 13, further comprising using coefficients of odd-rank spherical harmonic functions to extract information on MRI artifacts.

18. A method for analyzing magnetic resonance imaging (MRI) data, comprising:
representing MRI data of a body part as a summation of spherical harmonic functions in three dimensions relative to unknown principal axes of diffusion in the body part; and
separating terms of the spherical harmonic functions to represent isotropic diffusion by a coefficient of a spherical harmonic function of a rank of zero and anisotropic diffusion effects by coefficients of even-rank spherical harmonic functions embedded in the MRI data.

19. The method as in claim 18, further comprising using coefficients of odd-rank spherical harmonic functions to extract information on MRI artifacts.

20. The method as in claim 18, further comprising using coefficients of even-rank spherical harmonic functions to compute a relative anisotropy index (RA) and a fractional anisotropy index (FA).

21. A method for processing MRI data, comprising:
constructing MRI images from high angular resolution diffusion data;
using gradient directions to determine measurement angles and spherical Voronoi areas in the MRI images;
computing spherical harmonic functions at specified gradient angles and integration measures from the spherical Voronoi areas;
computing a spherical harmonic transform for each voxel; and
using coefficients of the spherical harmonic transform to extract information on diffusion anisotropy.

* * * * *